United States Patent
Takizawa

(10) Patent No.: US 9,536,621 B2
(45) Date of Patent: Jan. 3, 2017

(54) NONVOLATILE MEMORY

(71) Applicant: KABUSHIKI KAISHA TOSHIBA, Minato-ku, Tokyo (JP)

(72) Inventor: Ryousuke Takizawa, Naka Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/080,778

(22) Filed: Mar. 25, 2016

(65) Prior Publication Data

US 2016/0211036 A1 Jul. 21, 2016

Related U.S. Application Data

(63) Continuation of application No. 14/458,872, filed on Aug. 13, 2014, now Pat. No. 9,324,457.

(Continued)

(51) Int. Cl.
*G11C 11/00* (2006.01)
*G11C 17/16* (2006.01)
(Continued)

(52) U.S. Cl.
CPC .......... *G11C 17/165* (2013.01); *G11C 11/161* (2013.01); *G11C 11/1675* (2013.01); *G11C 17/16* (2013.01);
(Continued)

(58) Field of Classification Search
CPC ........ G11C 11/16; G11C 29/70; G11C 11/161; G11C 11/1675; G11C 17/165; G11C 17/16; G11C 2029/4402; G11C 29/028; G11C 29/50; G11C 13/0004; G11C 13/0007; G11C 13/0028; G11C 17/02; G11C 2029/1208; G11C 2213/31
(Continued)

(56) References Cited

U.S. PATENT DOCUMENTS

2002/0012272 A1 1/2002 Shukuri et al.
2004/0240255 A1 12/2004 Smith et al.
(Continued)

FOREIGN PATENT DOCUMENTS

| JP | 2001168196 A | 6/2001 |
| JP | 2009200197 A | 9/2009 |
| JP | 2009283506 A | 12/2009 |

*Primary Examiner* — Thong Q Le
(74) *Attorney, Agent, or Firm* — Holtz, Holtz & Volek PC

(57) ABSTRACT

A nonvolatile memory includes a memory area including plural first magnetoresistive elements each serving as a memory element, each first magnetoresistive element including a first storage layer and a first reference layer, with a first insulating film therebetween. A fuse circuit storing correction information of the memory area when a defect exists in the memory area, includes plural second magnetoresistive elements and plural fuse elements, the second magnetoresistive elements each serving as an anti-fuse element. Each second magnetoresistive element includes a second storage layer and a second reference layer, with a second insulating film therebetween. The fuse elements each store at least part of the correction information. A redundancy area includes plural third magnetoresistive elements each serving as a redundancy element, each third magnetoresistive element including a third storage layer and a third reference layer, with a third insulating film therebetween. When an external address signal matches the correction information, one third magnetoresistive element is selected.

11 Claims, 16 Drawing Sheets

Related U.S. Application Data

(60) Provisional application No. 61/951,961, filed on Mar. 12, 2014.

(51) Int. Cl.
*G11C 11/16* (2006.01)
*G11C 29/00* (2006.01)
G11C 29/44 (2006.01)

(52) U.S. Cl.
CPC ....... *G11C 29/70* (2013.01); *G11C 2029/4402* (2013.01)

(58) Field of Classification Search
USPC ......... 365/158, 173, 148, 171, 200, 96, 163, 365/230.03, 230.06, 51
See application file for complete search history.

(56) References Cited

U.S. PATENT DOCUMENTS

2006/0092689 A1* 5/2006 Braun .................... G11C 7/067
365/158
2011/0063886 A1 3/2011 Hashimoto et al.

\* cited by examiner

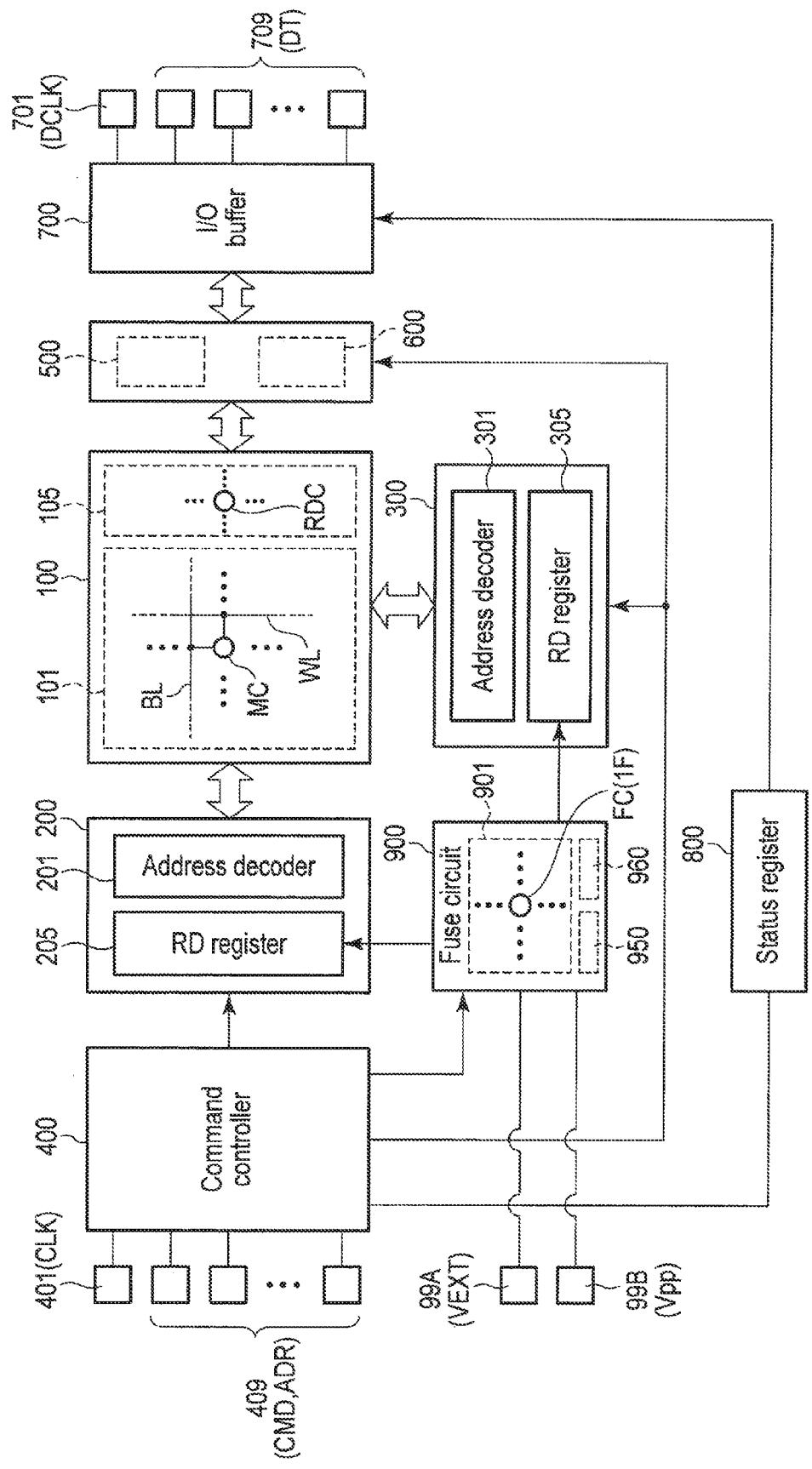
F I G. 1

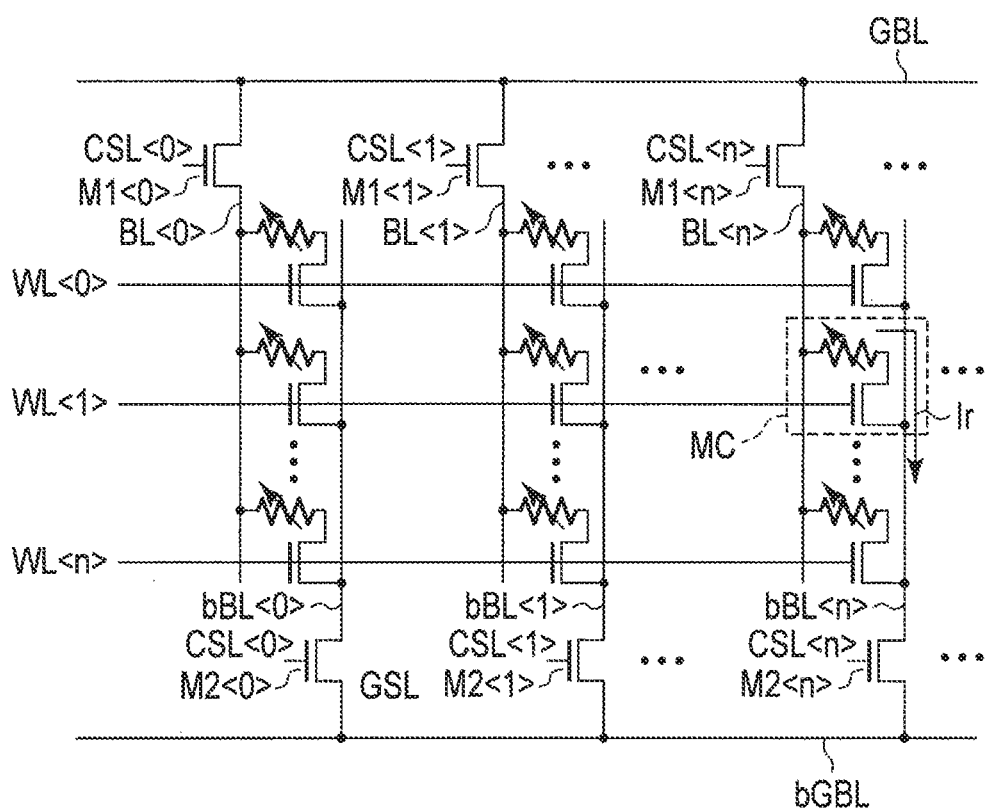
F I G. 2

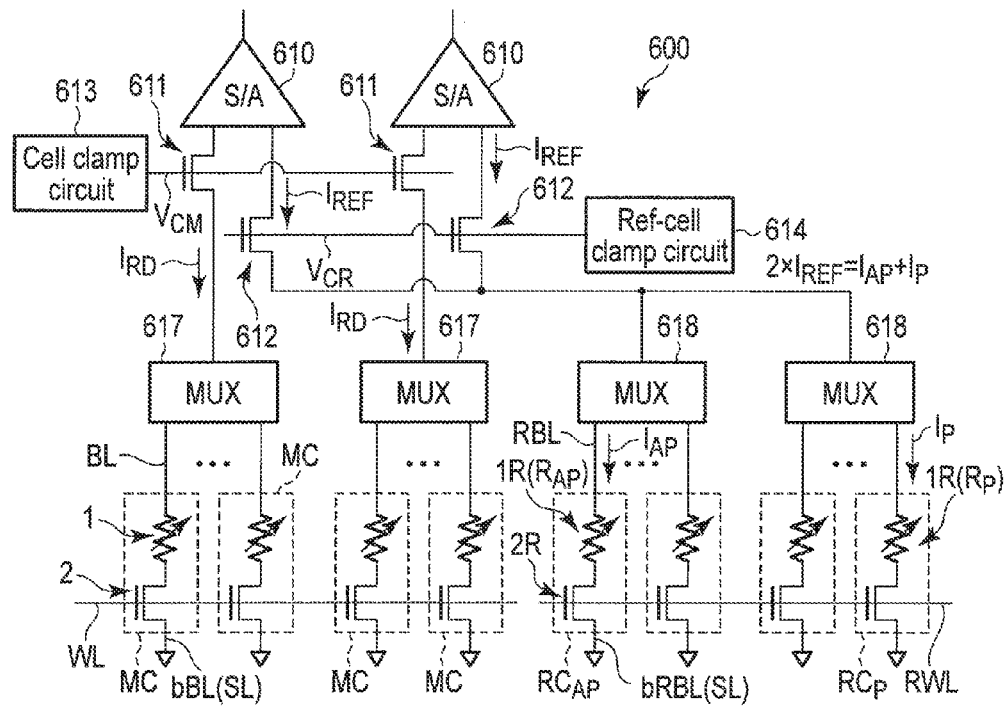
F I G. 5
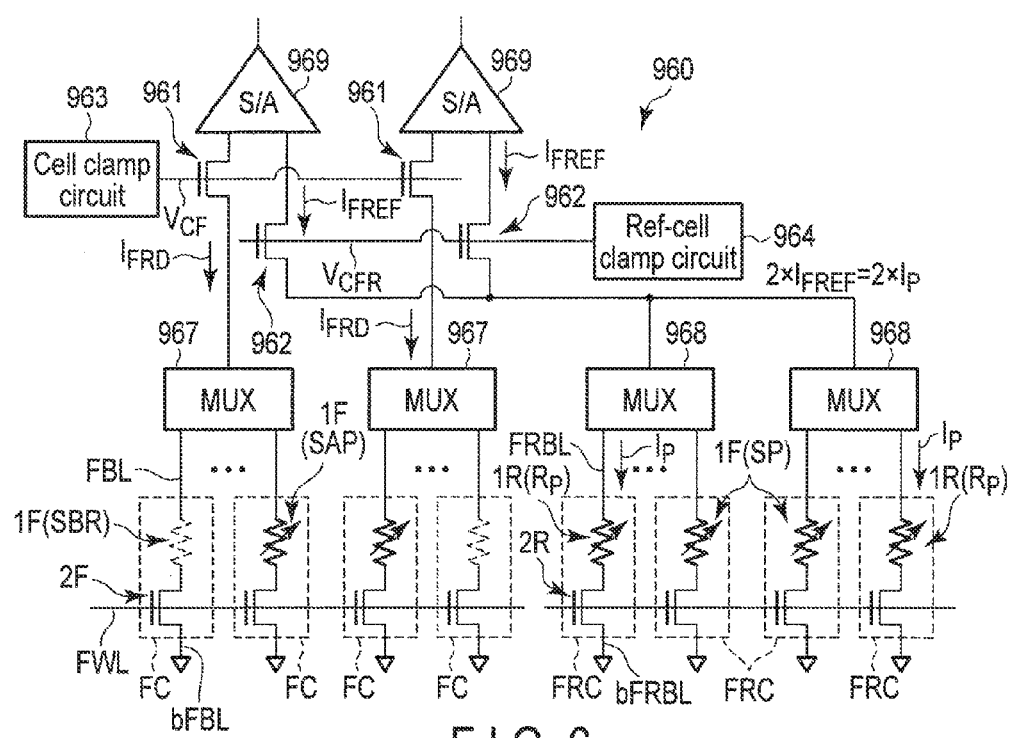
F I G. 6

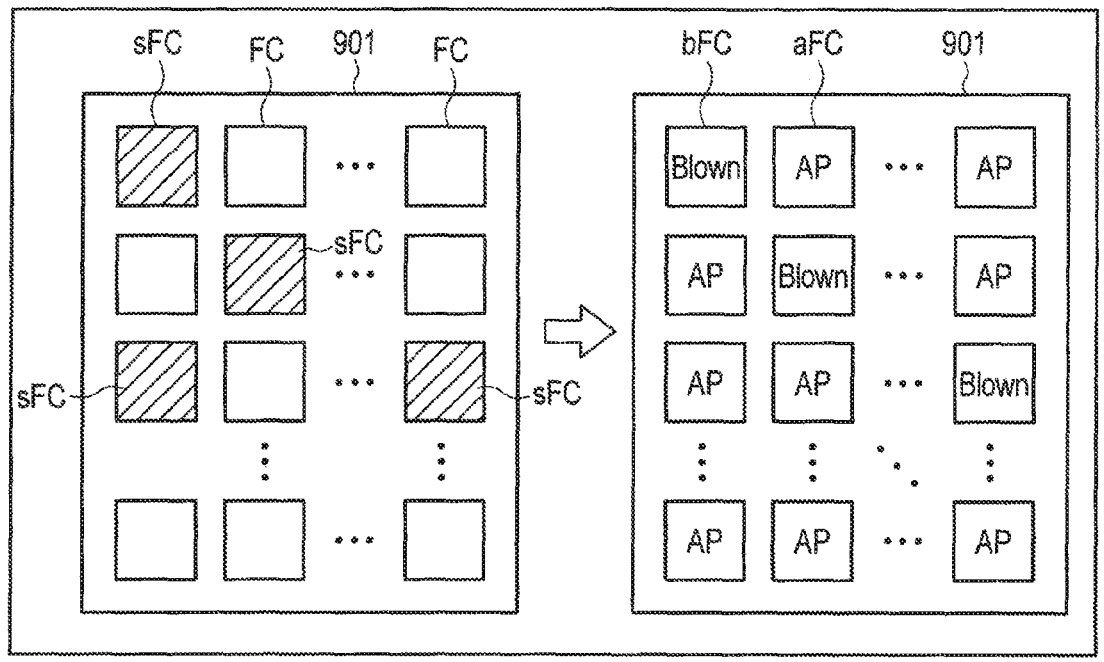
F I G. 14
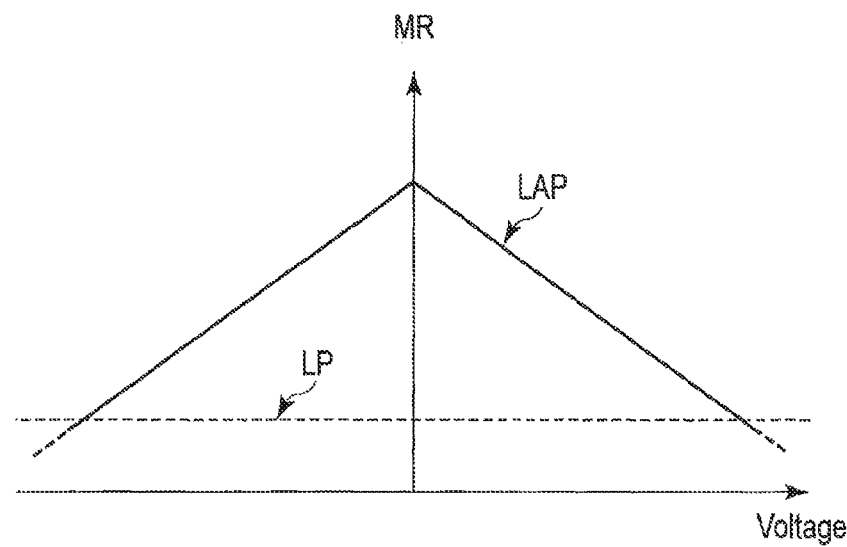
F I G. 15

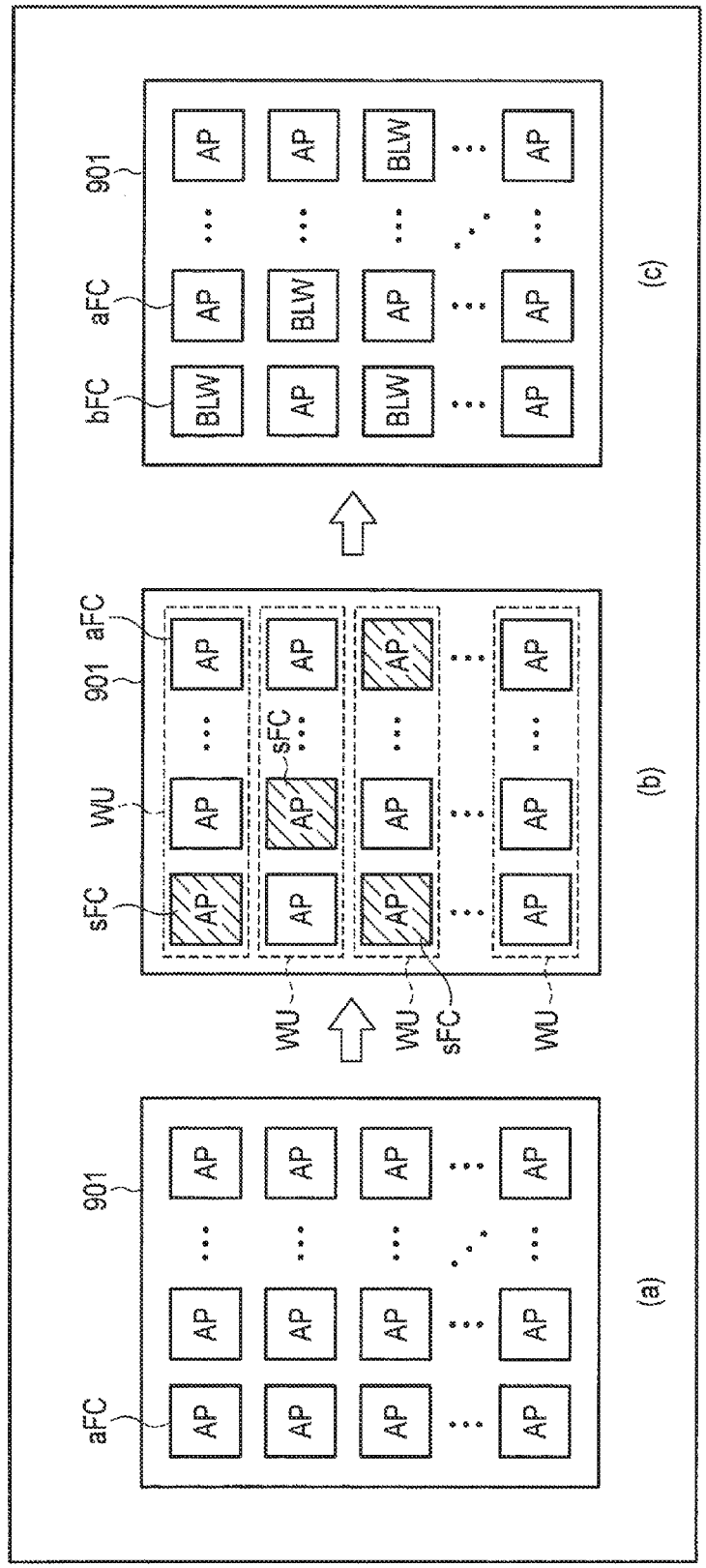
F I G. 16

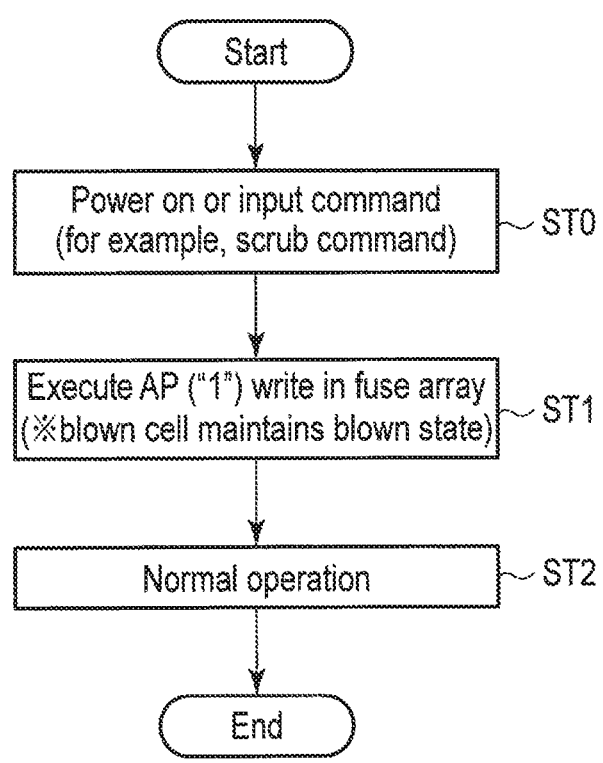
F I G. 17

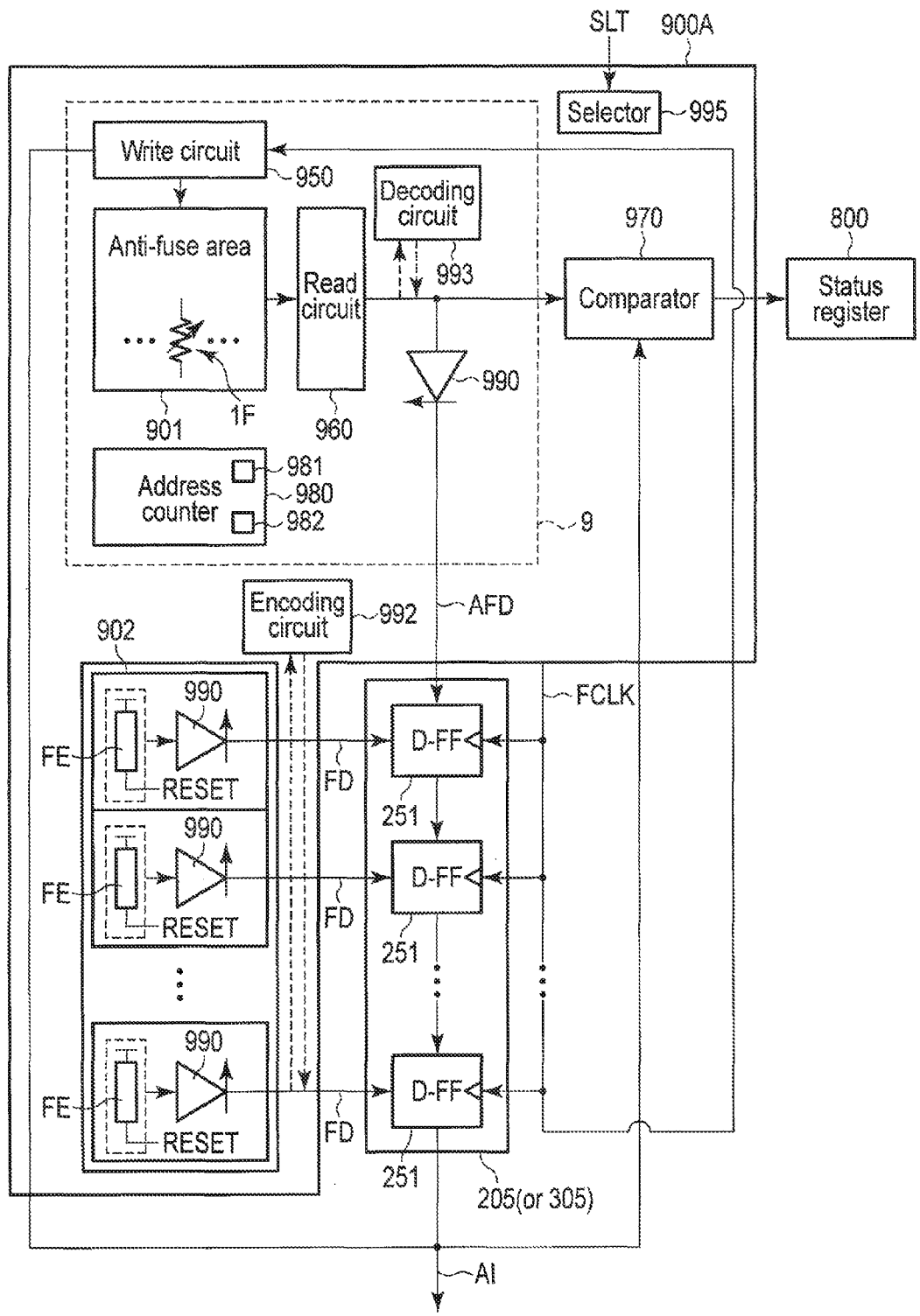
F I G. 24

NONVOLATILE MEMORY

CROSS-REFERENCE TO RELATED APPLICATIONS

This application is a Continuation application of U.S. Ser. No. 14/458,872, filed Aug. 13, 2014, which claims the benefit of U.S. Provisional Application No. 61/951,961, filed Mar. 12, 2014, the entire contents of both of which are incorporated herein by reference.

FIELD

Embodiments described herein relate generally to a nonvolatile memory.

BACKGROUND

A semiconductor memory such as a DRAM or SRAM uses a fuse to store information (redundancy information) used to replace a defective circuit with a redundancy circuit in the memory. The fuse has a high reliability but occupies a large area in the chip.

As a method for improving the chip occupancy in a semiconductor memory, using a nonvolatile memory element as a fuse or anti-fuse is demanded.

BRIEF DESCRIPTION OF THE DRAWINGS

FIG. 1 is a block diagram for explaining the overall configuration of a nonvolatile memory according to an embodiment;

FIG. 2 is a circuit diagram for explaining an example of the configuration of the memory cell array of the nonvolatile memory according to the embodiment;

FIG. 5 is a block diagram for explaining the read circuit of the memory element of the nonvolatile memory according to the embodiment;

FIG. 6 is a block diagram for explaining the read circuit of the fuse element of the nonvolatile memory according to the embodiment;

FIGS. 14 to 16 are views for explaining write of the fuse element of the nonvolatile memory according to the embodiment;

FIG. 17 is a flowchart for explaining the operation of the nonvolatile memory according to the embodiment;

FIG. 24 is a block diagram for explaining an example of the configuration of a nonvolatile memory according to another embodiment.

DETAILED DESCRIPTION

Figure 3:
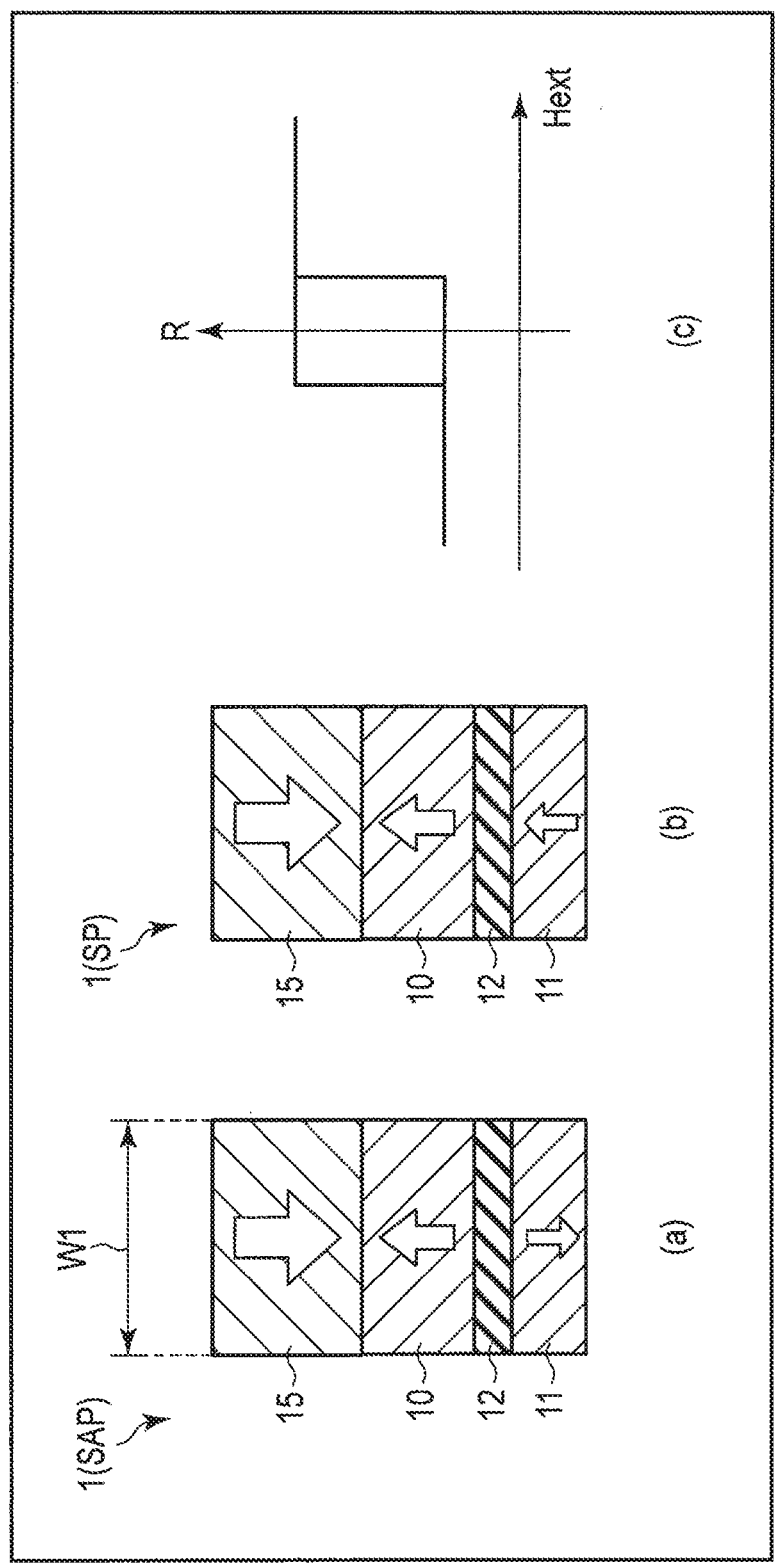
FIG. 3 shows views for explaining a memory element of the nonvolatile memory according to the embodiment.

Embodiments of the present invention will now be described in detail with reference to the accompanying drawings. In the following explanation, the same reference numerals denote elements having the same functions and configurations, and a repetitive explanation will be made as needed.

In general, according to one embodiment, a nonvolatile memory includes a memory area including a plurality of first magnetoresistive elements each serving as a memory element, and a fuse circuit including a plurality of second magnetoresistive elements each serving as an anti-fuse element and configured to store correction information of the memory area when a defect exists in the memory area. Each of the first magnetoresistive elements includes a first storage layer, a first reference layer, and a first insulating film between the first storage layer and the first reference layer. Each of the second magnetoresistive elements includes a second storage layer, a second reference layer, and a second insulating film between the second storage layer and the second reference layer.

Embodiment

(1) First Embodiment

A nonvolatile memory according to the first embodiment will be described with reference to FIGS. 1 to 23.

<Overall Configuration>

The overall configuration of the nonvolatile memory according to the embodiment will be explained with reference to FIGS. 1 to 4.

FIG. 1 is a block diagram for explaining the main part of the circuit configuration of the nonvolatile memory according to the embodiment.

The nonvolatile memory according to the embodiment includes a cell array 100, a column control circuit 200, a row control circuit 300, a command controller 400, a write circuit 500, a read circuit 600, an I/O buffer 700, a status register 800, and a fuse circuit 900.

The cell array 100 includes a memory cell MC that stores data and a redundancy cell RDC configured to ensure redundancy of the memory cell MC. In the cell array 100, a plurality of memory cells MC are provided in a memory cell area 101 of the cell array 100, and a plurality of redundancy cells RDC are provided in a redundancy area 105 of the cell array 100.

The command controller 400 receives signals from the external device (for example, host device) of the nonvolatile memory. The signals from the external device are supplied to a plurality of pads 401 and 409. For example, a clock signal CLK, commands CMD, and address signals ADR are input from the external device to the command controller 400 of the memory via the pads 401 and 409. The commands CMD include a chip select signal CS, a column address strobe signal CAS, a row address strobe signal RAS, and a write enable signal WE.

Control signals from the command controller 400 are transferred to the fuse circuit 900, the column control circuit 200, the row control circuit 300, the write circuit 500, the read circuit 600, and the status register 800.

The fuse circuit 900 stores information (to be referred to as correction information hereinafter) used to replace a defective memory cell (to be referred to as a defective cell hereinafter) that has occurred in the cell array 100 (to be described later) with a redundancy cell in the cell array 100. For example, information stored in the fuse circuit 900 includes a column address and a row address, which represent the position of a defective cell in the memory cell area. Note that the fuse circuit 900 may store the column address and row address of a defective redundancy cell to replace the defective redundancy cell with another redundancy cell.

The fuse circuit 900 includes a plurality of fuse cells provided in a fuse area 901. Each fuse cell includes a fuse element 1F. In this embodiment, a fuse element 1F is an anti-fuse. The fuse circuit 900 includes a read circuit 960 configured to read information from the fuse element 1F, and a write circuit 950 configured to write information in the fuse element 1F.

The fuse circuit 900 has a predetermined error correcting capability.

An external voltage VEXT or an external boosted voltage Vpp is supplied to the fuse circuit 900 via a pad 99A or 99B serving as a connection terminal to the external device.

The column control circuit 200 controls the columns of the memory cell array 100, and the row control circuit 300 controls the rows of the memory cell array 100. The column control circuit 200 and the row control circuit 300 include address decoders 201 and 301, respectively. The column control circuit 200 and the row control circuit 300 include redundancy registers 205 and 305, respectively.

The redundancy registers (to be also referred to as redundancy address registers) 205 and 305 store correction information read out from the fuse circuit 900. When the pieces of correction information stored in the redundancy registers 205 and 305 match a column address and row address included in an external address signal, the redundancy cell RDC is selected as an operation target in place of the memory cell MC.

The address decoders 201 and 301 compare the address signal ADR with the correction information, and decode internal addresses corresponding to the operation target cell.

The read circuit 600 and the write circuit 500 execute data read from a memory cell (or redundancy cell) of the memory cell array 100 and data write in a memory cell (or redundancy cell), respectively.

The I/O buffer 700 is a buffer circuit configured to execute data transmission/reception between the nonvolatile memory and the external device and status information transmission/reception between the memory and the external device via an interface. Data DT and a data clock DCLK are input/output to/from the nonvolatile memory via a plurality of pads 701 and 709 of the I/O buffer 700.

FIG. 2 is a circuit diagram for explaining an example of the internal configuration of the cell array of the resistance change memory according to this embodiment.

As shown in FIG. 2, the plurality of memory cells MC are provided in a matrix in the memory cell area 101 of the cell array 100.

A plurality of bit lines (sub-bit lines/local bit lines) BL<0>, BL<1>, . . . , BL<n>, and bBL<0>, bBL<1>, . . . , bBL<n> and a plurality of word lines (sub-word lines/local word lines) WL<0>, WL<1>, . . . , WL<n> are provided in the memory cell area 101. The bit lines BL<0>, BL<1>, . . . , BL<n> will be referred to as bit lines BL when they are not discriminated, and the bit lines bBL<0>, bBL<1>, . . . , bBL<n> will be referred to as bit lines bBL when they are not discriminated. The plurality of word lines WL<0>, WL<1>, . . . , WL<n> will be referred to as word lines WL when they are not discriminated.

The bit lines BL and bBL extend in the column direction, and the word lines WL extend in the row direction. Two bit lines BL and bBL form a pair of bit lines.

The memory cells MC are connected to the bit lines BL and bBL and the word lines WL.

A plurality of memory cells MC arrayed in the column direction are connected to a pair of bit lines BL and bBL. A plurality of memory cells MC arrayed in the row direction are connected to a common word line WL.

In a hierarchical bit line method, the plurality of bit lines BL<0>, BL<1>, . . . , BL<n> are connected to one global bit line GBL via local column switches M1<0>, M1<1>, . . . , M1<n>, respectively, and the plurality of bit lines nBL<0>, nBL<1>, . . . , nBL<n> are connected to the other global bit line GBL via local column switches M2<0>, M2<1>, . . . , M2<n>, respectively.

The local column switches M1<0>, M1<1>, . . . , M1<n>, and M2<0>, M2<1>, . . . , M2<n> are on/off-controlled by control signals CSL<0>, CSL<1>, . . . , CSL<n>, respectively.

The local column switches M1<0>, M1<1>, . . . , M1<n>, and M2<0>, M2<1>, . . . , M2<n> will be referred to as local column switches M1 and M2 when they are not discriminated.

For example, in a hierarchical word line method, the plurality of word lines WL are connected to a global word line GWL via sub-word line drivers or local row switches (not shown).

The memory cell MC includes, for example, one resistance change element 1 serving as a memory element and one select switch 2. The resistance value of the resistance change element 1 serving as a memory element reversibly changes depending on a given voltage or current. A state in which the resistance value of the resistance change element 1 has changed is substantially nonvolatilely maintained. The resistance change element 1 serving as a memory element stores predetermined data using such a characteristic. The select switch 2 is a field effect transistor (for example, n-channel type MOS transistor). The field effect transistor serving as the select switch 2 in the memory cell MC will be referred to as the cell transistor (or select transistor) 2 hereinafter.

One terminal of the resistance change element 1 is connected to the bit line BL, and the other terminal of the resistance change element 1 is connected to one end (source/drain) of the current path of the cell transistor 2. The other end (drain/source) of the current path of the cell transistor 2 is connected to the bit line bBL. The control terminal (gate) of the cell transistor 2 is connected to the word line WL.

The plurality of redundancy cells RDC are provided in the redundancy cell area 105 of the cell array 100 so as to have the same configuration as in the memory cell area shown in FIG. 2. For example, the number of cells in the redundancy cell area 105 is smaller than that in the memory cell area 101.

The redundancy cell RDC includes a resistance change element serving as a memory element and a cell transistor, like the memory cell MC. The redundancy cell RDC is connected to the bit line and the word line, like the memory cell.

When a defective cell in the memory cell area is selected by the external device, not the selected defective cell but the redundancy cell RDC as a replacement target is accessed based on correction information in the fuse circuit 900.

FIG. 3 shows views of an example of the structure of the memory element of the nonvolatile memory according to this embodiment.

For example, when the nonvolatile memory is an STT (Spin Transfer Torque)-MRAM, a magnetoresistive element is used as the resistance change element serving as the memory element.

In FIG. 3, (a) and (b) are sectional views showing an example of the structure of a magnetoresistive element. The magnetoresistive element 1 serving as the resistance change element (memory element) 1 includes a magnetic layer 11 having a changeable magnetization direction, a magnetic layer 10 having a fixed (unchangeable) magnetization direction, and a nonmagnetic layer 12 between the two magnetic layers 10 and 11.

The magnetic layer 11 having a changeable magnetization direction will be referred to as the storage layer (or recording layer or magnetization free layer) 11 hereinafter. The magnetic layer 10 having an unchangeable magnetization direction will be referred to as the reference layer (or pin layer, pinned layer, or magnetization unchangeable layer) 10. The nonmagnetic layer 12 will be referred to as the tunnel barrier layer (or intermediate layer) 12. For example, the tunnel barrier layer 12 is formed from an insulating film mainly containing MgO.

The storage layer 11, the tunnel barrier layer 12, and the reference layer 10 form a magnetic tunnel junction. The magnetoresistive element 1 including the magnetic tunnel junction will be referred to as the MTJ element 1 hereinafter.

The two magnetic layers 10 and 11 have magnetic anisotropy in a direction perpendicular to their film surfaces. The magnetization of the two magnetic layers 10 and 11 faces in the direction perpendicular to the film surfaces. When such magnetic layers having magnetization facing in the direction perpendicular to the film surfaces are used in the MTJ element, a size (diameter) W1 of the MTJ element 1 in a direction parallel to the substrate surface becomes small. As a result, the memory element and the memory cell of the resistance change type memory can be made small.

For example, the MTJ element 1 shown in FIG. 3 includes a shift adjustment layer 15. The magnetization direction of the shift adjustment layer 15 is opposite to that of the reference layer.

The magnetization direction of the storage layer 11 is changed by supplying a current having a predetermined magnitude into the MTJ element 1. When the magnetization direction of the storage layer 11 changes, the relative magnetization alignments of the storage layer 11 and the reference layer 10 change, and the MTJ element 1 is set in a high resistance state or a low resistance state.

When the magnetization of the storage layer 11 of the MTJ element 1 and that of the reference layer 10 face in opposing directions (antiparallel state), as shown in (a) of FIG. 3, the MTJ element 1 is set in a high resistance state. When the magnetization of the storage layer 11 of the MTJ element 1 and that of the reference layer 10 face in the same direction (parallel state), as shown in (b) of FIG. 3, the MTJ element 1 is set in a low resistance state.

The resistance state of the MTJ element 1 and data to be stored are associated, thereby using the MTJ element 1 as a memory element.

In FIG. 3, (c) shows a graph for explaining the magnetic characteristic of the MTJ element. The abscissa of the graph in (c) of FIG. 3 corresponds to an external magnetic field, and the ordinate of the graph in (c) of FIG. 3 corresponds to the magnetoresistance (MR) of the MTJ element.

As shown in (c) of FIG. 3, the MTJ element can attain a high resistance state or a low resistance state in accordance with its magnetization alignment state. When the shift adjustment layer 15 as shown in (a) and (b) of FIG. 3 is provided, a shifted magnetic field caused by a leakage magnetic field from the reference layer 10 to the storage layer 11 is canceled.

Accordingly, the MTJ element can relax the influence of a shifted magnetic field and obtain a hysteresis loop characteristic representing that a stable point exists in each of a high resistance state and a low resistance state with respect to the state of a zero magnetic field, like the characteristic shown in (c) of FIG. 3. For example, an MTJ element in a high resistance state corresponds to a "1" data holding state, and an MTJ element in a low resistance state corresponds to a "0" data holding state.

Changing the resistance state of the MTJ element 1 using STT is executed by supplying a current into the MTJ element 1. As shown in FIG. 2, a write current I flowing from the side of the storage layer 11 to the side of the reference layer 10 or a current flowing from the side of the reference layer 10 to the side of the storage layer 11 is supplied to the MTJ element 1 in accordance with data to be written (the resistance state of the MTJ element to be changed).

To prevent the magnetization direction of the reference layer 10 from changing when a current for changing the magnetization direction of the storage layer 11 is supplied, the magnetization reversal threshold of the reference layer 10 is set to be larger than that of the storage layer 11. When a current equal to or larger than the magnetization reversal threshold of the storage layer 11 of the MTJ element 1 and smaller than the magnetization reversal threshold of the reference layer 10 is supplied to the MTJ element 1 as a write current (write pulse), the relative magnetization direction between the storage layer 11 and the reference layer 10 reverses. The resistance value of the MTJ element 1 thus changes, and predetermined data is written in the MTJ element 1 serving as a memory element.

A write that makes the magnetization alignment of the MTJ element parallel will be referred to as P write (parallel write), and a write that makes the magnetization alignment of the MTJ element antiparallel will be referred to as AP write (antiparallel write) hereinafter.

In the MRAM according to this embodiment, the MTJ element 1F is provided in the anti-fuse circuit 900 as the fuse element 1F.

Figure 4:
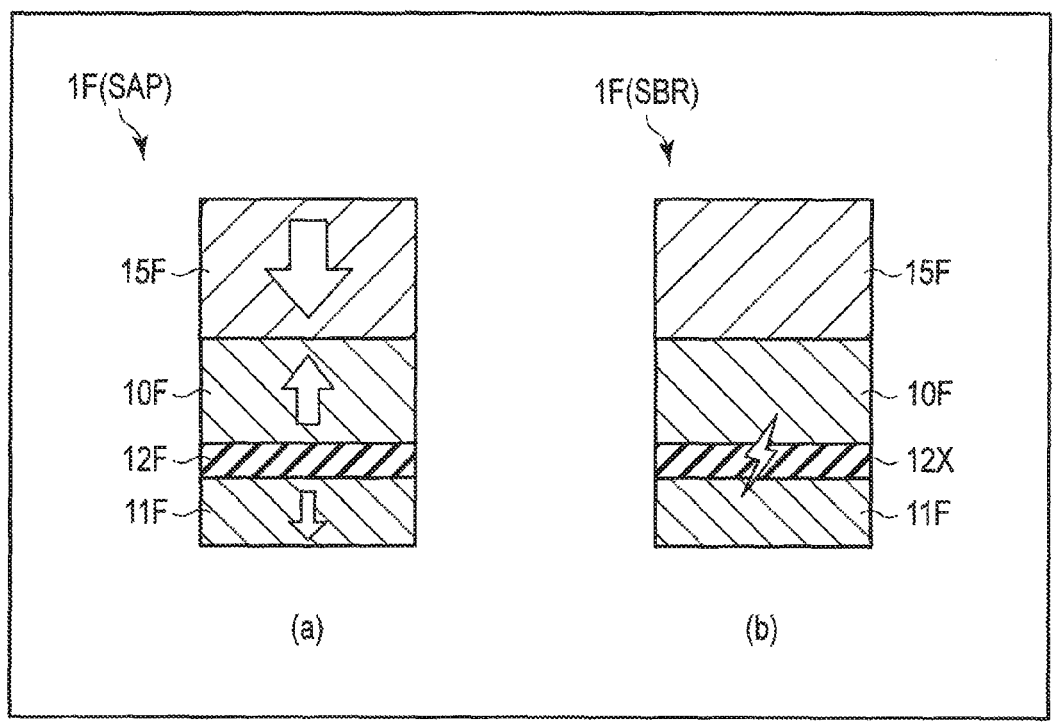
FIG. 4 shows views for explaining a fuse element of the nonvolatile memory according to the embodiment.

In FIG. 4, (a) and (b) are sectional views for explaining the anti-fuse element 1F formed from an MTJ element.

The MTJ element 1F serving as an anti-fuse element has substantially the same structure as the MTJ element 1 serving as a memory element. As shown in (a) of FIG. 4, the MTJ element 1F serving as an anti-fuse element includes a reference layer 10F, a storage layer 11F, a tunnel barrier layer 12F, and a shift adjustment layer 15F.

The MTJ element 1F in the fuse circuit 900 is used as an anti-fuse element by causing dielectric breakdown in the tunnel barrier layer (insulating film) 12F between the magnetic layers 10F and 11F.

The MTJ element 1F serving as an anti-fuse element is set in one of the two states shown in (a) and (b) of FIG. 4 in accordance with correction information to be stored.

As shown in (a) of FIG. 4, the MTJ element 1F serving as an anti-fuse element is set in an antiparallel state as one data holding state of the anti-fuse element.

As shown in (b) of FIG. 4, as the other data holding state of the anti-fuse element, the MTJ element 1F serving as an anti-fuse element is set in a state in which dielectric breakdown has occurred in a tunnel barrier layer 12X. The element whose tunnel barrier layer 12X has caused dielectric breakdown loses its magnetic tunnel junction and magnetoresistance and therefore forms a fixed resistive element or interconnection having a resistance value smaller than that of an MTJ element in the parallel state. In the element whose tunnel barrier layer 12X has caused dielectric breakdown, the resistance value does not largely vary because it is not changed by magnetization alignment reversal caused by heat or an external magnetic field.

A state in which dielectric breakdown has occurred in the tunnel barrier layer 12X of the MTJ element 1F serving as an anti-fuse element will be referred to as a blown state hereinafter.

In this embodiment, the MTJ element 1F used as an anti-fuse element will be referred to as the anti-fuse MTJ element 1F for the sake of descriptive clarification. When the anti-fuse element is set in the blown state, the MTJ element serving as the anti-fuse element loses its function as an MTJ element. In this embodiment, however, an MTJ element whose tunnel barrier layer has been broken by blow processing will be referred to as an MTJ element in a blown state for the sake of descriptive simplicity.

By using the MTJ element as an anti-fuse element in this way, correction information used to replace a defective cell with a redundancy cell is stored in the fuse circuit 900. Correction information (also called redundancy information, replacement information, or defect repair information) is programed in the MTJ element serving as an anti-fuse element. At the time of operation of the MRAM, a redundancy cell is accessed in place of a defective cell in the cell array 100 based on the programed correction information.

The fuse circuit 900 includes a circuit 950 configured to do write to write data in the MTJ element 1F serving as an anti-fuse element, and a circuit 960 configured to do data read from the MTJ element 1F serving as an anti-fuse element.

The internal configuration of the nonvolatile memory (for example, MRAM) that uses the anti-fuse MTJ element 1F in the fuse circuit will be described below in more detail.

<Data Read of Anti-Fuse Element>

Circuit configurations for data read of an MTJ element serving as a memory element and an MTJ element serving as an anti-fuse element will be described with reference to FIGS. 5 to 8.

FIG. 5 is a diagram showing an example of the configuration of the read circuit (memory read circuit) configured to read data stored in a memory cell.

Data read of the MRAM is executed using a reference value generated by a reference cell RC.

As shown in FIG. 5, reference bit lines RBL and bRBL and a reference word line RWL are connected to the cell (to be referred to as the reference cell hereinafter) RC configured to generate a determination criterion of data read. The reference cell RC has substantially the same configuration as that of the memory cell MC. A resistive element (for example, MTJ element) and a cell transistor 2R are provided in the reference cell RC. The current path of the reference cell RC is connected between the reference bit lines RBL and bRBL. The reference word line RWL is connected to the gate of the cell transistor 2R.

A predetermined number of a plurality of bit lines BL are connected to a multiplexer 617 (for example, column switch circuit). Based on an address signal, a predetermined multiplexer 617 is selected out of the plurality of multiplexers 617, and one bit line BL is selected out of the plurality of bit lines connected to the selected multiplexer 617.

A predetermined number of a plurality of reference bit lines RBL are connected to a multiplexer 618. The multiplexer 618 selects a predetermined reference bit line RBL based on an address signal.

The plurality of bit lines BL are connected to one input terminal of a sense amplifier 610 in the read circuit 600 via the multiplexer 617, and the plurality of reference bit lines RBL are connected to the other input terminal of the sense amplifier 610 via the multiplexer 618.

Clamp transistors 611 and 612 are connected to the one and the other input terminals of the sense amplifier 610, respectively.

A control voltage (clamp voltage) VCM output from a clamp circuit 613 is applied to the gate of the clamp transistor 611 connected to one input terminal of the sense amplifier 610. When the control voltage VCM is applied to the clamp transistor 611, a current (to be referred to as a read current hereinafter) $I_{RD}$ flowing into the memory cell MC is generated. The read current $I_{RD}$ flows from the bit line BL on the sense amplifier side (high potential side) to the bit line (source line) bBL (SL) on the ground side (low potential side) via the cell transistor 2 in the on state in the selected cell MC. The read current $I_{RD}$ having a magnitude corresponding to the resistance value of the MTJ element of the selected cell flows to one input terminal of each sense amplifier 610. To suppress occurrence of a read disturb, the read current $I_{RD}$ is set to a value smaller than the magnetization reversal threshold of the storage layer.

A control voltage (clamp voltage) $V_{CR}$ output from a clamp circuit 614 is applied to the gate of the clamp transistor 612 connected to the other input terminal of the sense amplifier 610. When the control voltage $V_{CR}$ is applied to the clamp transistor 612, a current flows into the reference cell RC. The current flowing into the reference cell RC flows from the reference bit line RBL on the sense amplifier side (high potential side) to the reference bit line (reference source line) bRBL (RSL) on the ground side (low potential side) via the cell transistor 2R in the on state in the reference cell RC.

A reference current $I_{REF}$ generated by the reference cell RC is used as a reference value for data read of the memory cell MC. The magnitude of the read current $I_{RD}$ and that of the reference current $I_{REF}$ are compared, thereby determining whether the MTJ element 1 in the memory cell MC through which the read current $I_{RD}$ flows is in a high resistance state (antiparallel state or "1" data holding state) or in a low resistance state (parallel state or "0" data holding state).

For example, the reference current $I_{REF}$ is generated using a reference cell $RC_{AP}$ including an MTJ element 1R in an antiparallel state (high resistance value $R_{AP}$) and a reference cell $RC_P$ including the MTJ element 1R in a parallel state (low resistance value $R_P$). Accordingly, a current having an intermediate current value between the current flowing to the MTJ element in the antiparallel state and the current flowing to the MTJ element in the parallel state flows to the other input terminal of the sense amplifier 610 as the reference current IREF.

The current value $(I_p+I_{ap})/2$ obtained by averaging the current of the MTJ element in the low resistance state and the current of the MTJ element in the high resistance state in the above-described way is used as the reference current IREF.

When a reference current $(N \times I_p + N \times I_{ap})/(2 \times N)$ is generated using N MTJ elements in the high resistance state and N MTJ elements in the low resistance state, a more conspicuous current value averaging effect can be obtained, and the accuracy of the reference current IREp as a reference value improves.

The clamp voltage $V_{CR}$ on the reference cell side may have substantially the same magnitude as the clamp voltage $V_{CM}$ on the memory cell side. To improve the read margin, the voltage value of the clamp voltage $V_{CR}$ on the reference cell side may be offset from the voltage value of the clamp voltage $V_{CM}$ on the memory cell side so as to adjust the magnitude of the reference current $I_{REF}$. For example, based on the average value of currents $I_P$ flowing to MTJ elements in the low resistance state, the clamp voltage $V_{CR}$ (or reference current) on the reference cell side may be offset with respect to the clamp voltage $V_{CM}$ (or read current) on the memory cell side.

According to the circuit configuration shown in FIG. 5, data can simultaneously be read from a plurality of memory cells MC using a set of reference cells (one or more cells) configured to generate a reference current.

FIG. 6 is a diagram showing an example of the configuration of the read circuit (fuse read circuit) configured to read data stored in an MTJ element serving as an anti-fuse.

For example, as shown in FIG. 6, a fuse cell FC is formed by the MTJ element 1F serving as an anti-fuse element and a cell transistor 2F. The fuse cells FC are arranged in a matrix in the anti-fuse area (anti-fuse array) 901 of the fuse circuit 900.

For example, the read circuit 960 for data read of the fuse cell FC is provided in the fuse circuit 900.

The connection relationship between the fuse cell FC and a sense amplifier 969 of the read circuit 960 is substantially the same as that between the memory cell MC and the read circuit 600.

More specifically, a plurality of bit lines (to be referred to as fuse bit lines hereinafter) FBL and bFBL each connected to the fuse cell FC are connected to one input terminal of the sense amplifier 969 via a multiplexer 967.

The one input terminal of the sense amplifier 969 is connected to the multiplexer 967 via a clamp transistor 961.

As described above, to store the information (address) of a defective cell, the MTJ element 1F serving as an anti-fuse element is set in one of the blown state (MTJ broken state) and the antiparallel state.

A reference current $I_{FREF}$ generated by a reference cell FRC is used for data read of the fuse cell FC, like the memory cell MC.

A plurality of reference bit lines FRBL and bFRBL are connected to the other input terminal of the sense amplifier 969 via a multiplexer 968. The other input terminal of the sense amplifier 969 is connected to the multiplexer 968 via a clamp transistor 962.

Clamp voltages $V_{CF}$ and $V_{CFR}$ from clamp control circuits 963 and 964 are applied to the gates of the clamp transistors 961 and 962, and a read current $I_{FRD}$ and the reference current $I_{FREF}$ for data read of the fuse cell FC are generated.

For example, the reference current $I_{FREF}$ for data read of the anti-fuse MTJ element 1F is generated using the MTJ element 1R in the low resistance state (low resistance value RP) or a resistive element having a resistance value corresponding to the MTJ element in the low resistance state.

The clamp voltage $V_{CFR}$ on the reference cell side may have substantially the same magnitude as the clamp voltage $V_{CF}$ on the fuse cell side. In this case, the read circuit 960 for an anti-fuse cell can share clamp control circuits 963 and 964 for the fuse cell FC and the reference cell FRC.

Data read (resistance value determination) of an MTJ element serving as an anti-fuse element will be described next with reference to FIGS. 7 and 8. Data read of an MTJ element serving as an anti-fuse will be explained here in comparison with data read of an MTJ element serving as a memory element.

Figure 7:
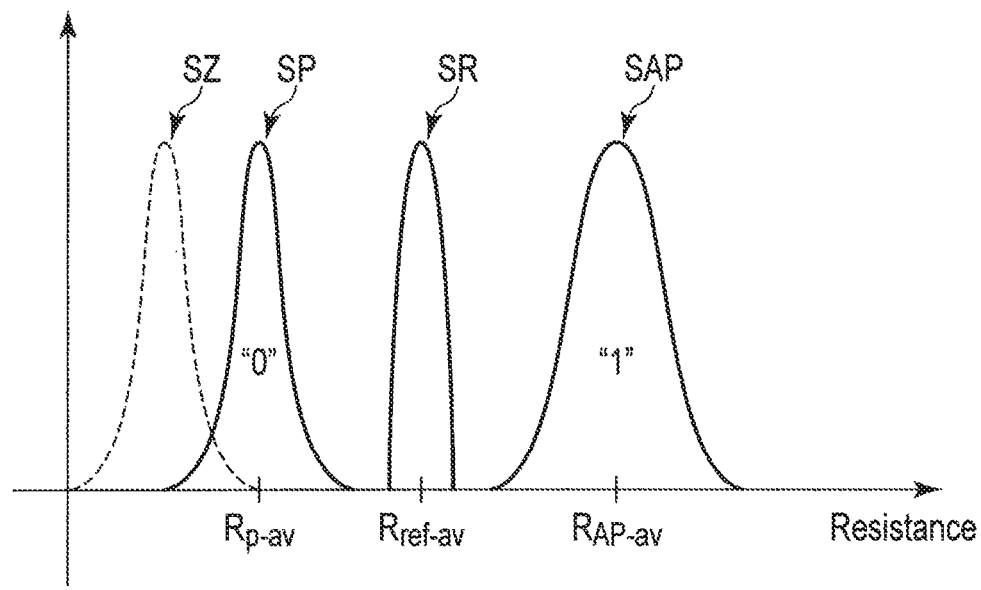
FIG. 7 is a graph for explaining read of the memory element of the nonvolatile memory according to the embodiment.

FIG. 7 is a graph for explaining data read of an MTJ element serving as a memory element. The abscissa of FIG. 7 corresponds to the resistance value of the MTJ element, and the ordinate of FIG. 7 corresponds to the number of MTJ elements.

A distribution SAP in FIG. 7 represents the distribution of MTJ elements in the high resistance state ("1" data holding state). A distribution SP in FIG. 7 represents the distribution of MTJ elements in the low resistance state ("0" data holding state). For example, the extension of the distribution SAP of MTJ elements in the high resistance state is larger than that of the distribution of MTJ elements in the low resistance state. The resistance value of an MTJ element in the high resistance state will be referred to as "$R_{AP}$", and the resistance value of an MTJ element in the low resistance state will be referred to as "$R_P$". The resistance value RAP corresponds to an average value (the central value of the distribution) $R_{AP-av}$ of the resistance values in the distribution SAP of the MTJ elements in the high resistance state, and the resistance value $R_P$ corresponds to an average value (the central value of the distribution) $R_{P-av}$ of the resistance values in the distribution SP of the MTJ elements in the low resistance state.

For example, a parasitic resistance formed from the sum of resistances such as the on resistance of transistors, wiring resistance, and contact resistance exists in the path through which the read current flows. A distribution SZ shown in FIG. 7 represents the distribution of parasitic resistances.

According to FIG. 7, the characteristic of the MTJ elements in the cell array can be regarded as the statistical information in the chip.

If the distribution of the MTJ elements in the respective resistance states is assumed to be approximate to a normal distribution, as shown in FIG. 7, reading data of a memory cell is equivalent to discriminating between the distribution of MTJ elements in the low resistance state (parallel state) and the distribution of MTJ elements in the high resistance state.

Hence, a reference resistance $R_{REF-av}$ is set at the intermediate point between the distribution of MTJ elements in the low resistance state (parallel state) and the distribution of MTJ elements in the high resistance state. The reference resistance is a resistance value formed by the above-described reference cell. Since the reference resistance is subject to variation, like the resistance value of MTJ elements, preferably, an average value of a plurality of reference cells is obtained, and a reference value with a smaller variation is formed.

Data read of a memory cell is thus executed as a result of discrimination of the resistance state of the MTJ element.

Figure 8:
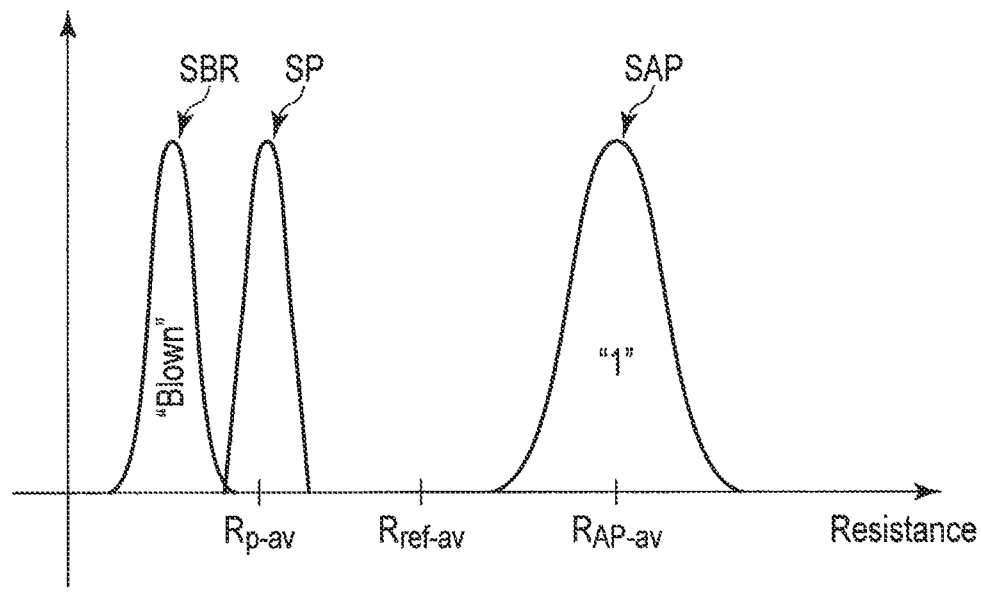
FIG. 8 is a graph for explaining read of the fuse element of the nonvolatile memory according to the embodiment.

FIG. 8 is a graph for explaining data read of an MTJ element serving as an anti-fuse element. The abscissa of FIG. 8 corresponds to the resistance value of the anti-fuse element, and the ordinate of FIG. 8 corresponds to the number of anti-fuse elements.

In this embodiment, an anti-fuse element in the blown state corresponds to an MTJ element in a state in which the tunnel barrier layer is broken.

An MTJ element in a state (blown state) in which the tunnel barrier layer is broken loses its magnetoresistance. Hence, a resistance value $R_{blown}$ of the MTJ element in the blown state exhibits a value close to the resistance value of a magnetic layer made of a metal. For this reason, the resistance value $R_{blown}$ of the MTJ element in the blown state is expected to be smaller than the resistance value $R_P$ of the MTJ element in the low resistance state, and can be handled as almost equivalent to a resistance value Rz of a parasitic resistance.

On the other hand, in this embodiment, an anti-fuse element in an unblown state corresponds to an MTJ element in the high resistance state.

Reading data of the fuse cell FC is equivalent to discriminating between a distribution SBR of MTJ elements in the state in which the tunnel barrier layer is broken and the distribution SAP of MTJ elements in the high resistance state.

Since the resistance value of the MTJ element in the blown state is smaller than that of the MTJ element in the low resistance state, the resistance value $R_P$ of the MTJ element in the low resistance state can be used as a reference value used to discriminate between the MTJ element in the blown state and the MTJ element in the high resistance state. For example, the resistance value of the MTJ element in the blown state is about 1/10 the resistance value of the MTJ element in the low resistance state. A large interval can be ensured between the distribution of MTJ elements in the blown state and the distribution of MTJ elements in the high resistance state.

For this reason, as shown in FIG. 6, in the read circuit 960 of the fuse circuit, the reference cell FRC is formed from an MTJ element in the low resistance state. The current $I_P$ flowing to a resistive element (MTJ element) having the resistance value RP flows to the other input terminal of each sense amplifier 969 as the reference current $I_{FREF}$.

The average value of the resistance values of a plurality of MTJ elements in the low resistance state is obtained. A reference resistance for an anti-fuse element formed from the resistance value of the MTJ element in the low resistance state is set between the distribution SBR of MTJ elements in the blown state and the distribution SAP of MTJ elements in the high resistance state. For example, to discriminate between the distribution SBR of MTJ elements in the blown state and the distribution SAP of MTJ elements in the high resistance state, the determination criterion value obtained from the resistance values of the plurality of MTJ elements in the low resistance state is preferably offset in accordance with the magnitude of the parasitic resistance.

Since the determination criterion of data read of an anti-fuse MTJ element can be formed from MTJ elements in the low resistance state, data read of the fuse cell can be facilitated, and the read circuit 960 having an architecture approximate to that of the read circuit 600 of the memory cell MC can be applied to data read of the fuse cell FC.

<Data Write in Anti-Fuse Element>

Data write in an MTJ element serving as a memory element and an MTJ element serving as an anti-fuse element and circuit configurations for the data write will be described with reference to FIGS. 9 to 16.

Figure 10:
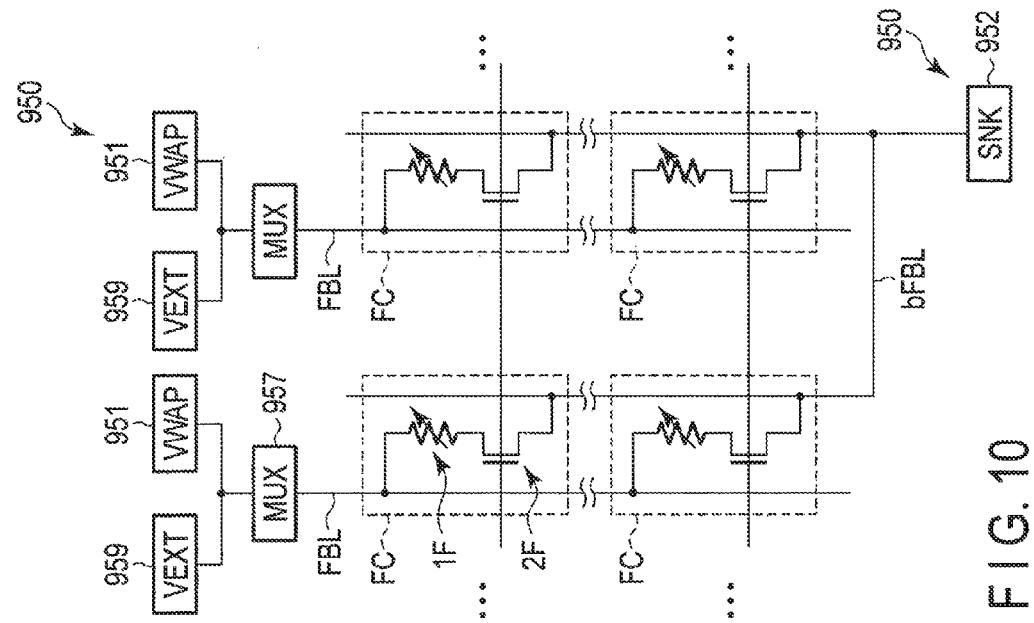
FIG. 10 is a block diagram for explaining the write circuit of the fuse element of the nonvolatile memory according to the embodiment.
Figure 9:
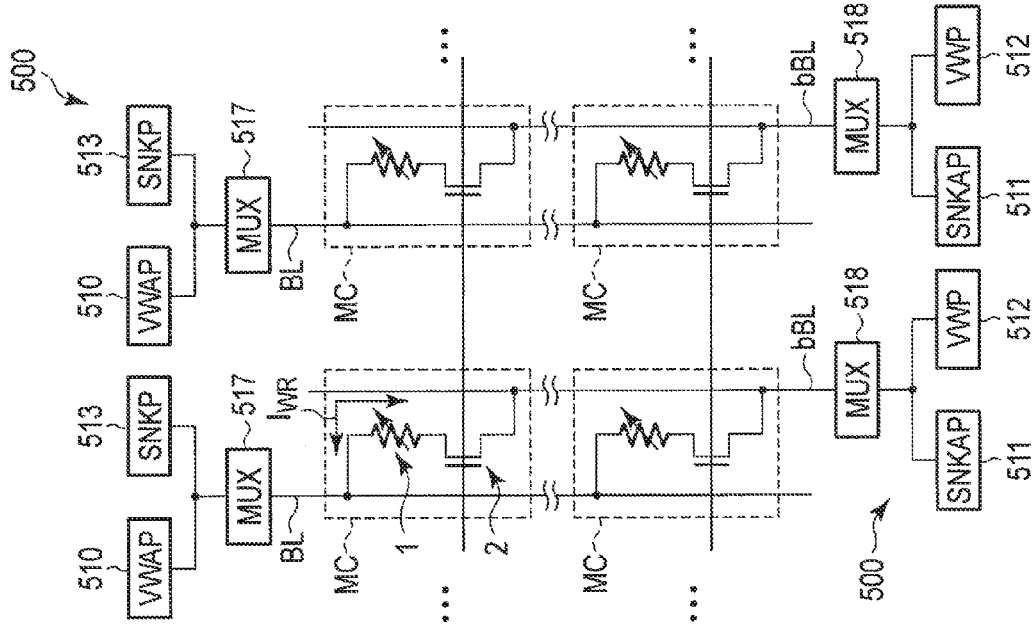
FIG. 9 is a block diagram for explaining the write circuit of the memory element of the nonvolatile memory according to the embodiment.

FIGS. 9 and 10 are diagrams for explaining circuit configurations for data write in a memory element and an anti-fuse element of the MRAM according to this embodiment.

FIG. 9 is diagram for explaining the write circuit of a memory cell of the MRAM according to this embodiment.

As shown in FIG. 9, in the STT-MRAM, the write circuit 500 includes source circuits (for example, voltage sources/current sources) 510 and 512 configured to generate a write current IwR, and sink circuits 511 and 513 configured to absorb the write current IwR.

The source circuits 510 and 512 and the sink circuits 511 and 513 are connected to the bit lines BL and bBL via multiplexers 517 and 518.

As described above, data write in the STT-MRAM includes P write that makes the magnetization alignment of an MTJ element parallel and AP write that makes the magnetization alignment of an MTJ element antiparallel. For this reason, the write circuit 500 is formed such that a write current flowing from the storage layer side to the reference layer side or a write current flowing from the reference layer side to the storage layer side is supplied to the MTJ element in accordance with data to be written in the MTJ element serving as a memory element.

When executing AP write, the source circuit 510 for AP write is connected to the bit line BL via the multiplexer 517, and the sink circuit 511 for AP write is connected to the bit line bBL via the multiplexer 518. The write current IWR for AP write is thus supplied to the MTJ element 1 in the selected cell MC via the cell transistor 2 in the on state.

When executing P write, the source circuit 512 for P write is connected to the bit line bBL via the multiplexer 518, and the sink circuit 513 for P write is connected to the bit line BL via the multiplexer 517. The write current $I_{WR}$ for P write is thus supplied to the MTJ element 1 in the selected cell MC via the cell transistor 2 in the on state.

In this way, predetermined data is written in the MTJ element in the memory cell.

FIG. 10 is a block diagram for explaining data write in an anti-fuse of the MRAM according to this embodiment.

When an MTJ element is used as an anti-fuse element as in this embodiment, data write in the anti-fuse MTJ element is an operation (to be referred to as blow write hereinafter) of breaking the tunnel barrier layer of the MTJ element or an operation (AP write) of making the magnetization alignment of the MTJ element antiparallel.

For this reason, the write direction (the direction in which the write current flows) to the anti-fuse MTJ element can be of the same polarity.

As shown in FIG. 10, source circuits 951 and 959 are connected to the fuse bit line FBL that is one line of the pair of bit lines FBL and bFBL of the fuse cell FC via a multiplexer 957. A sink circuit 952 is connected to the fuse bit line bFBL that is the other line of the pair of bit lines FBL and bFBL.

One of the source circuit 951 for AP write and the source circuit 959 for blow write is selected by the multiplexer 957 in accordance with data to be written in the anti-fuse MTJ element 1F, and the selected source circuit is connected to the fuse bit line FBL.

For example, the power supply of the source circuit 959 for blow write is, for example, the external power supply VEXT provided from an external apparatus such as a test apparatus. When the external power supply VEXT capable of applying a high voltage to the MTJ element is used as a power supply configured to set the anti-fuse MTJ element in the blown state, the time of dielectric breakdown of the anti-fuse MTJ element can be shortened.

To do blow write and AP write in the anti-fuse MTJ element, a voltage/current of the same polarity is supplied to the MTJ element. Hence, as shown FIG. 10, the fuse bit lines bFBL on the sink circuit side can be connected among a plurality of pairs of bit lines. For example, the fuse bit lines bFBL on the sink circuit side (ground side) may be connected to each other among four to eight pairs of bit lines.

Note that the voltage used to cause dielectric breakdown of the anti-fuse MTJ element 1F may be generated by boosting the external rated voltage Vpp using a charge pump circuit in the chip.

Figure 11:
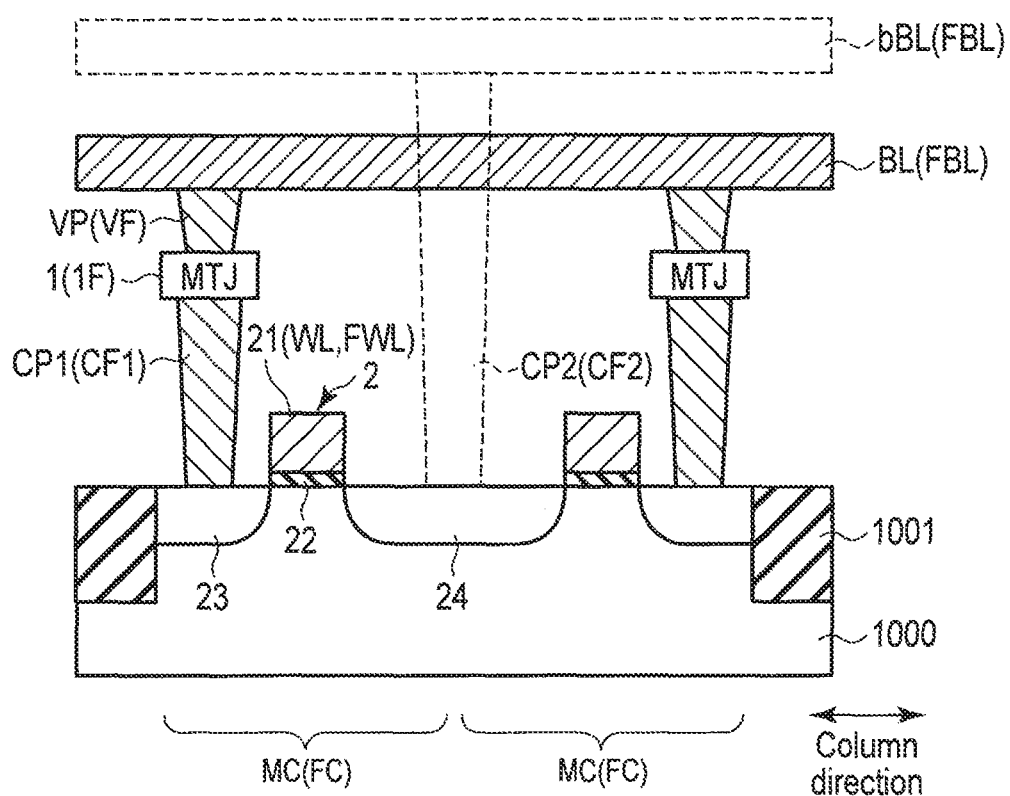
FIGS. 11 to 13 are views for explaining the structures of cells including the memory element and the fuse element of the nonvolatile memory according to the embodiment.
Figure 13:
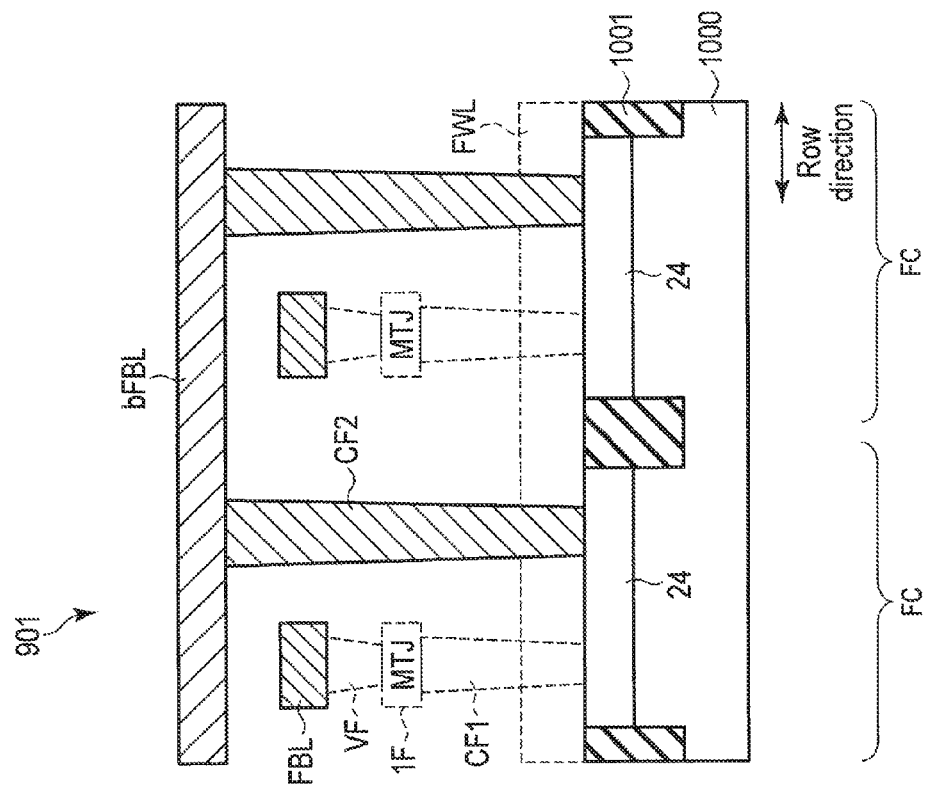
Figure 12:
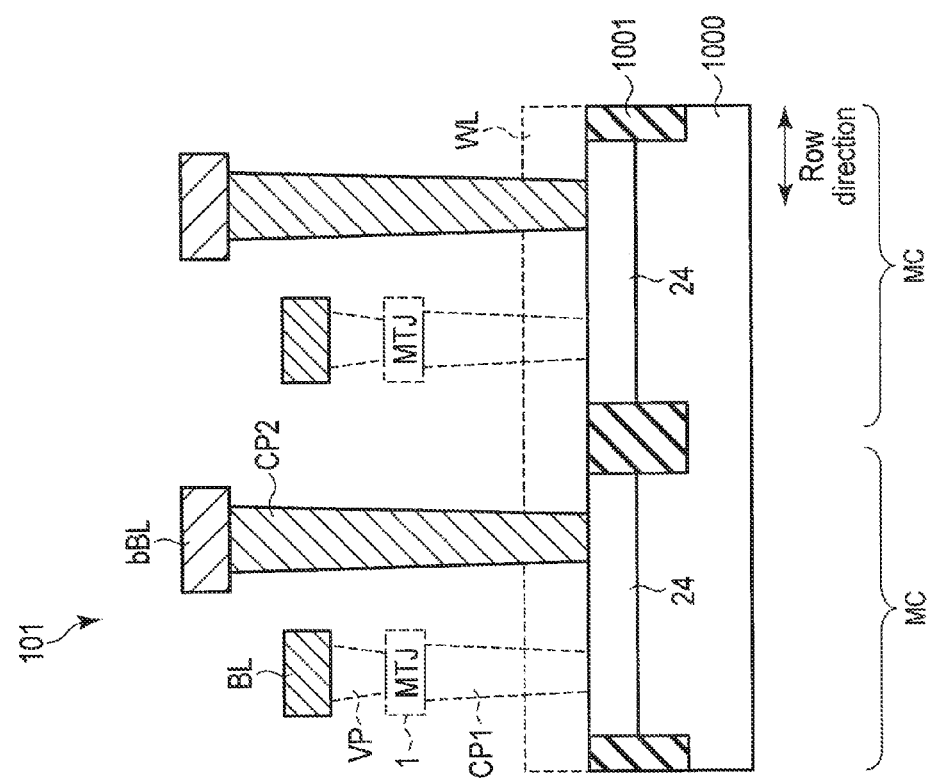

FIGS. 11 to 13 are views for explaining the structures of a memory cell and a fuse cell of the MRAM according to this embodiment.

FIG. 11 is a view showing the sectional structure of the memory cells (fuse cells) along the column direction. FIG. 12 is a view showing the sectional structure of the memory cells along the row direction. FIG. 13 is a view showing the sectional structure of the fuse cells along the row direction. Referring to FIGS. 11 to 13, members on the far side (or near side) are indicated by broken lines. For the sake of descriptive clarification, FIGS. 11 to 13 do not illustrate the interlayer dielectric film that covers the elements and substrate.

As shown in FIG. 11, the sectional structure of the memory cell MC and that of the fuse cell FC along the column direction (bit line extending direction) are substantially the same.

The memory cells MC and the fuse cells FC are provided in an active region (semiconductor region) defined by an element isolation insulating film 1001 in a semiconductor substrate 1000. Two memory cells MC (or fuse cells FC) are provided in one active region.

The cell transistor 2 is formed in the active region. The cell transistor 2 includes source/drain diffusion layers 23 and 24 provided in the active region. When two memory cells MC are provided in one active region, the two cell transistors 2 share one source/drain diffusion layer 24. A gate electrode 21 of the cell transistor 2 is provided on a gate insulating film 22 above the channel region between the source/drain diffusion layers 23 and 24. As shown in FIGS. 12 and 13, the gate electrode 21 extends in the row direction and functions as the word line WL (FWL).

The MTJ element 1 (or anti-fuse MTJ element) is connected to one source/drain diffusion layer 23 of the cell transistor 2 via a contact plug CP1 (or CF1). The MTJ element 1 (1F) is connected to the bit line BL via a via plug VP (VF).

The source/drain diffusion layer 24 shared by the two cell transistors 2 (2F) is connected to the bit line bBL (bFBL) via a contact plug CP2 (CF2).

As shown in FIG. 12, the bit lines bBL of the memory cells are separated for each of the memory cells arrayed in the row direction.

On the other hand, as shown in FIG. 13, in the fuse cell FC, the bit lines bFBL connected to a sink circuit are connected at terminations in the column direction or at a predetermined interval in the column direction and shared by a predetermined number of fuse cells arrayed in the row direction.

This makes it possible to decrease the resistance of the interconnection (bit line bFBL) on the sink circuit side in the fuse cell FC without largely changing the structure of the fuse cell FC from that of the memory cell MC.

As shown in FIGS. 9 to 13, the configuration for data write in the fuse cell is formed by changing the power supply mainly used for data write from the configuration for data write in the memory cell. It is therefore possible to relatively easily apply an MTJ element used as an anti-fuse element in the chip of the MRAM and apply a more suitable data write method to the fuse circuit including the MTJ element serving as an anti-fuse element.

A write operation in the fuse cell of the MRAM according to this embodiment will be described with reference to FIG. 14. FIG. 14 is a view for explaining data write in the fuse cell including the anti-fuse MTJ element.

Write of correction information of the cell array for the fuse circuit is executed based on a result of a test executed for the chip. As described above, data write in the anti-fuse MTJ element is AP write or blow processing.

As shown in FIG. 14, predetermined fuse cells FC are selected as the target of blow write or the target of AP write based on correction information to be written. In the example of FIG. 14, the blow write target fuse cells FC are selected as selected cells sFC.

For example, a write unit WU is set in the anti-fuse area (anti-fuse array) 901. Data write is simultaneously executed for a plurality of fuse cells FC belonging to the common write unit WU. For example, the write unit WU is set for each word line. Each write unit WU includes a plurality of fuse cells FC connected to a common word line. Note that the write unit WU set in the anti-fuse array 901 may be a bit line pair unit.

Blow write is executed for the selected cells sFC in each write unit.

The anti-fuse MTJ elements in the selected cells sFC are blown by the blow write, and predetermined data (correction information) is written in the fuse cell bFC.

After the predetermined fuse cells bFC are set in the blown state, AP write is executed for the remaining fuse cells FC in each write unit WU, and the anti-fuse MTJ element of a fuse cell aFC other than the fuse cells bFC in the blown state is set in the antiparallel state (high resistance state).

In this way, the fuse cells (called blown cells) bFC in the blown state and the fuse cells aFC in the antiparallel state are formed, and the correction information of the cell array is programmed in the anti-fuse area 901.

Note that when no defective cell exists in the cell array 100, correction information write in the fuse circuit is not executed. In this case, for example, the anti-fuse MTJ element 1F in the anti-fuse area 901 is not set in the blown state.

An application example of data write in the fuse cell will be described with reference to FIGS. 15 and 16.

FIG. 15 is a graph showing the voltage dependence of the resistance value of the MTJ element. The abscissa of FIG. 15 corresponds to the voltage applied to the MTJ element, and the ordinate of FIG. 15 corresponds to the resistance value (magnetoresistance) of the MTJ element.

Referring to FIG. 15, a line LP represents the voltage dependence of the resistance value of the MTJ element in the low resistance state, and a line LAP represents the voltage dependence of the resistance value of the MTJ element in the high resistance state.

As indicated by the line LP in FIG. 15, the resistance value of the MTJ element in the low resistance state is almost constant, and is independent of the magnitude of the voltage. On the other hand, as indicated by the line LAP in FIG. 15, the resistance value of the MTJ element in the high resistance state largely changes in accordance with a change in the voltage.

When dielectric breakdown of the tunnel barrier layer of the MTJ element is executed by applying a voltage, there is a high possibility that the tunnel barrier layer of the MTJ element in the high resistance state will cause dielectric breakdown with a small voltage value as compared with the MTJ element in the low resistance state. This is because when the breakdown phenomenon in the tunnel barrier layer is assumed to be caused by a stress voltage, a difference is generated voltage division in the resistance of the MTJ element and the remaining parasitic resistance in accordance with the resistance state of the MTJ element. For this reason, when the MTJ element in the fuse cell is set in the antiparallel state, and the MTJ element in the antiparallel state is then blown, the efficiency of correction information programming can be improved.

FIG. 16 is a view for explaining an application example of data write in a fuse cell including an anti-fuse MTJ element.

As shown in (a) of FIG. 16, for example, the magnetization alignments of all anti-fuse MTJ elements 1F in the anti-fuse area 901 are set in the antiparallel state by applying an external magnetic field. All fuse cells in the anti-fuse area 901 thus change to the cells aFC including MTJ elements in the antiparallel state.

As shown in (b) of FIG. 16, predetermined fuse cells sFC including MTJ elements to be set in the blown state are selected out of the fuse cells aFC including the anti-fuse MTJ elements 1F in the antiparallel state in accordance with the correction information of the cell array.

As shown in (c) of FIG. 16, the breakdown voltage VEXT is applied to the selected fuse cells FC for each write unit WU set in the anti-fuse area 901 based on the test result. The predetermined anti-fuse MTJ elements are thus set in the blown state.

As described above, it is possible to shorten the time of data write in the fuse circuit and reduce the power consumption by setting the anti-fuse MTJ element 1F in the high resistance state (antiparallel state) and then causing dielectric breakdown in the tunnel barrier layer of the MTJ element. This makes it possible to increase the efficiency of the manufacturing process of the MRAM using the MTJ element as an anti-fuse element and reduce the manufacturing cost of the MRAM.

<Attainment of Reliability of Data Stored in Anti-Fuse Element>

Magnetization of the storage layer of an MTJ element may unexpectedly reverse with a certain probability due to the influence of heat or an external magnetic field.

Hence, when an MTJ element is used as an anti-fuse element, preferably, the data holding states of the fuse cells FC in the fuse circuit 900 are confirmed at a certain timing during use of the memory, and data in the fuse cells are corrected.

In this embodiment, the data holding state of the MTJ element serving as an anti-fuse element is the blown state or antiparallel state.

Since the MTJ element in the blown state loses its magnetoresistance (magnetic tunnel junction), unexpected magnetization reversal does not occur due to heat or an external magnetic field. For this reason, unexpected magnetization reversal of the storage layer in the fuse circuit occurs in an anti-fuse MTJ element in the antiparallel state.

In this embodiment, data write in the fuse cell FC of the fuse circuit 900 at the time of use of the memory will be referred to as a reset write operation.

FIG. 17 is a flowchart for explaining the reset write operation for the fuse circuit of the MRAM according to this embodiment.

As shown in FIG. 17, a storage device including the MRAM according to this embodiment is powered on, or a command (for example, scrub command) is input to the storage device (step ST0).

At the timing of power-on or command input, the reset write operation for the fuse circuit 900 included in the MRAM according to this embodiment is executed (step ST1).

For example, AP write is executed for all fuse cells FC in the anti-fuse area 901 of the fuse circuit.

The anti-fuse MTJ elements 1F in the anti-fuse area 901 are set in the blown state or antiparallel state.

Even when AP write is executed for an MTJ element in the blown state, the resistance value of the MTJ element in the blown state does not change.

In all fuse cells except those including MTJ elements in the blown state, the MTJ elements in the anti-fuse area 901 are set in the high resistance state.

For this reason, when AP write is executed, the resistance state of each MTJ element in the high resistance state does not change, and each MTJ element that has changed to the low resistance state due to unexpected magnetization reversal of the storage layer is rewritten to the high resistance state.

Even when AP write is executed for all fuse cell FCs in the anti-fuse area 901 by the reset write operation, the correction information of the cell array to be stored only returns to or remains what it should be, that is, the correction information of the cell array to be stored does not change.

After the AP write for the fuse area 901, the MRAM according to this embodiment shifts to a normal operation such as data write, data read, or idle state in accordance with an external command (step ST2).

The reset write operation in the fuse circuit of the MRAM is thus completed.

Note that the reset write operation is preferably executed upon powering on the MRAM.

However, when the MRAM and the fuse circuit are normally off when used, write energy may increase. In this case, the reset write operation is preferably executed at a certain timing of external command supply.

As described above, in the fuse circuit including an MTJ element serving as an anti-fuse, rewrite for attaining the reliability of information stored in a fuse cell can be executed without reading the information stored in the fuse cell.

An error in the correction information caused by unexpected magnetization reversal of the storage layer can be corrected by the reset write operation for the fuse circuit including an MTJ element serving as an anti-fuse element.

It is therefore possible to improve the reliability of the MRAM including an MTJ element serving as an anti-fuse.

<Modification>

A modification of the MRAM using an MTJ element as an anti-fuse element will be described with reference to FIGS. 18 to 23.

Figure 18:
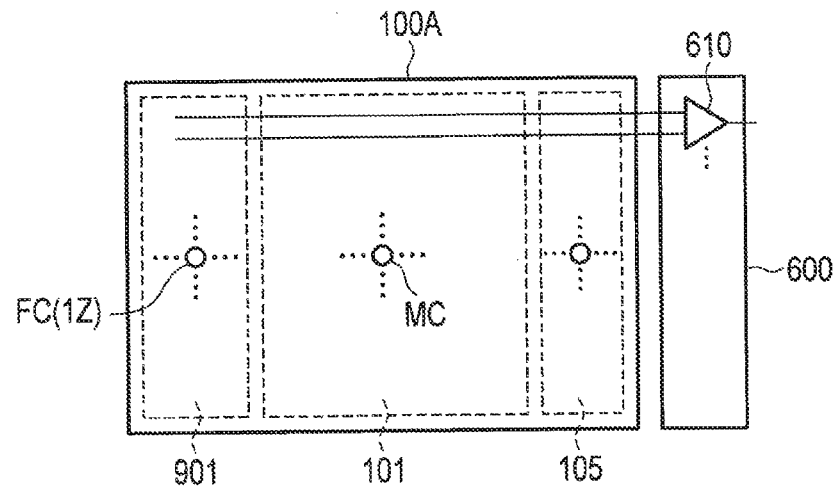
FIGS. 18 to 23 are views for explaining modifications of the nonvolatile memory according to the embodiment.

FIG. 18 is a block diagram showing a modification of the fuse circuit of the MRAM according to this embodiment.

In the embodiment, the anti-fuse element is formed from an MTJ element. Hence, as shown in FIG. 18, the MTJ element 1F serving as an anti-fuse element may be formed in the cell array 100.

The anti-fuse area 901 is provided in the cell array 100. A plurality of anti-fuse MTJ elements are arranged in a matrix in the anti-fuse area 901 of the cell array 100. The anti-fuse area 901 is adjacent to the memory cell area 101 in the column direction.

As shown in FIG. 18, when the anti-fuse area 901 is provided in the cell array, the read circuit of the fuse cell FC and the read circuit of the memory cell MC can share a circuit.

Figure 19:
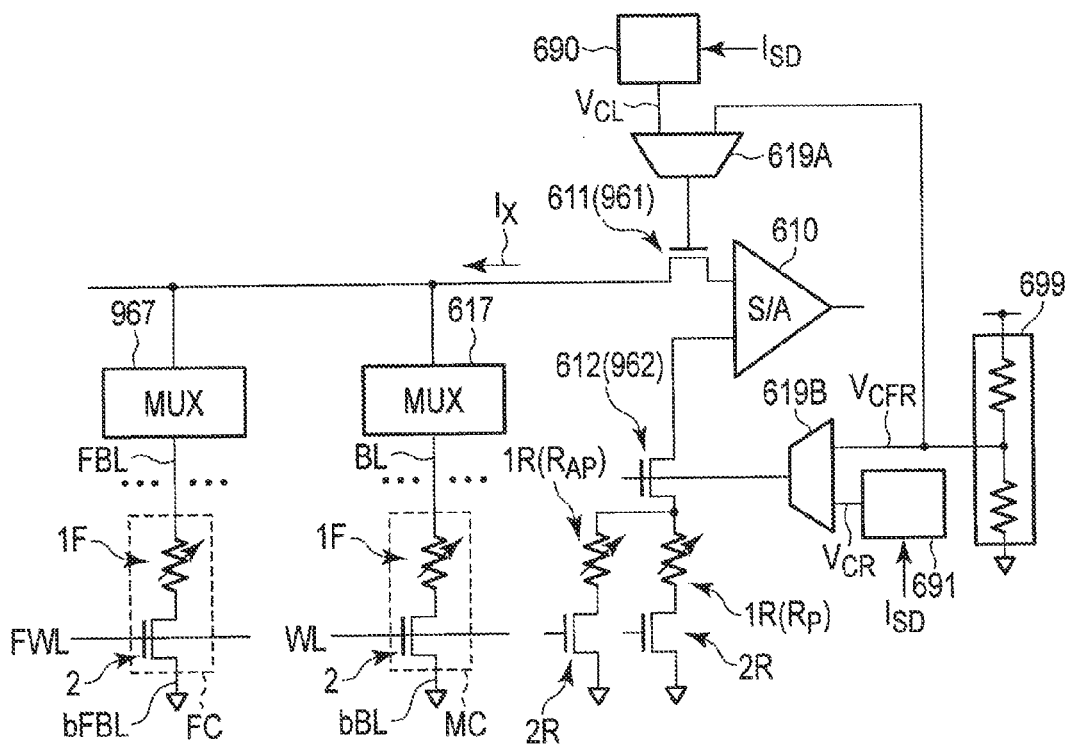

FIG. 19 is a block diagram for explaining an example of the configuration of the read circuit shared by the fuse cell FC and the memory cell MC.

The clamp transistor 611 on the data read side of the memory cell MC controls its clamp voltage $V_{CL}$, thereby supplying a read current $I_X$ corresponding to the average value of the resistance values $R_P$ of the MTJ elements in the low resistance state to the selected memory cell MC. The direction in which the read current $I_X$ flows is set to the direction in which the MTJ element changes from the low resistance state to the high resistance state. However, the current value of the read current Ix is set to be smaller than the reversal threshold that changes the MTJ element from the low resistance state to the high resistance state.

The read circuit 600 is formed so as to offset the clamp voltage $V_{CR}$ of the clamp transistor 612 on the determination criterion side from the clamp voltage $V_{CL}$ based on the average value of the resistance values $R_P$ of the MTJ elements in the low resistance state.

For the clamp voltage $V_{CL}$ on the read side of the memory element, a complex power supply circuit 690 configured to decide the upper limit of a small current value is preferably used in consideration of a read disturb. Accordingly, the power supply circuit of the clamp voltage $V_{CR}$ on the determination criterion side of the memory element also becomes complex, and offsets the current value of the reference current for data read of the memory element from the read current $I_X$. The power supply circuits 690 and 691 configured to generate the clamp voltages $V_{CL}$ and $V_{CR}$ are formed from, for example, current mirror circuits 690 and 691 driven by a common reference current ISD.

On the other hand, the clamp voltage $V_{CFR}$ on the fuse cell side and the determination criterion side, which is used for read of an anti-fuse MTJ element, can be shared, and a simple power supply circuit 699 can be used without needing to consider a read disturb. The power supply circuit 699 configured to generate the clamp voltage $V_{CFR}$ is, for example, the voltage division circuit 699 including a plurality of resistive elements.

When the read circuit 600 is shared by the fuse cell FC and the memory cell MC, the clamp voltage $V_{CR}$ on the determination criterion side for data read of the memory cell MC, the clamp voltage $V_{CL}$ on the read target side, and the clamp voltage $V_{CFR}$ for data read of the fuse cell FC are changed by selectors 619A and 619B. This allows the fuse cell FC and the memory cell MC to share the sense amplifier 610.

In accordance with whether the data read target is the memory cell MC or the fuse cell FC, one of the two voltage values $V_{CL}$ and $V_{CFR}$ as the clamp voltages is applied to the clamp transistor 611 (961) on the read target side under the control of the selector 619A, and one of the two voltage values $V_{CR}$ and $V_{CFR}$ as the clamp voltages is applied to the clamp transistor 612 on the determination criterion side under the control of the selector 619B.

When the fuse cell FC is provided in the cell array 100, the affinity between the circuit configured to drive the fuse cell FC and the circuit configured to drive the memory cell MC is high.

Figure 20:
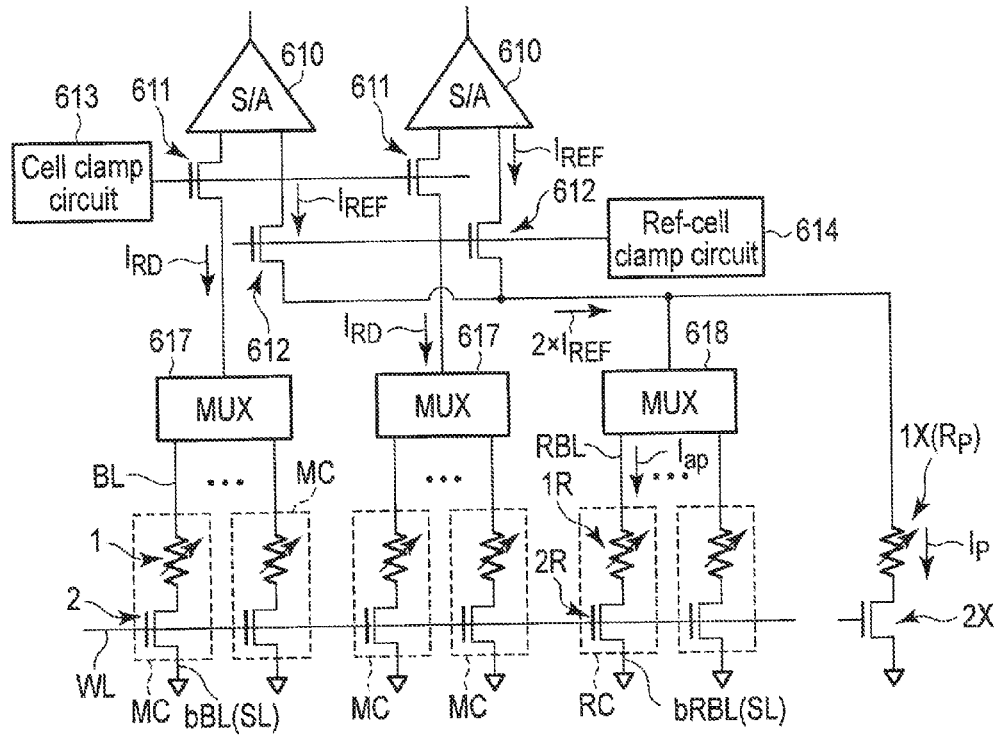
Figure 21:
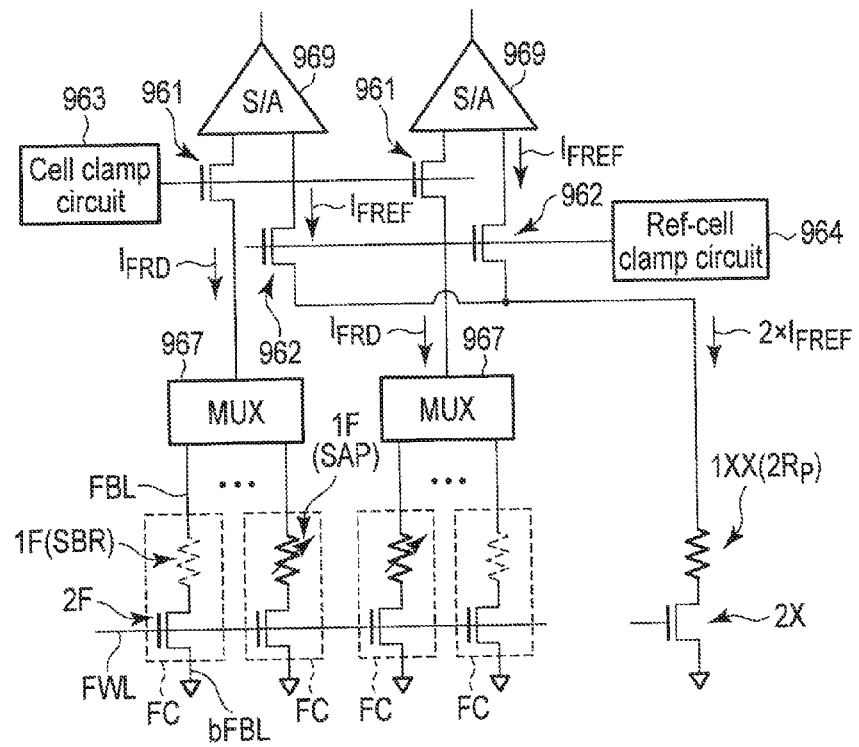

FIGS. 20 and 21 are diagrams showing a modification of the read circuits of the MRAM according to this embodiment.

FIG. 20 shows a modification of the read circuit for a memory cell. FIG. 21 shows a modification of the read circuit for a fuse cell.

As shown in FIG. 20, a resistive element configured to generate the reference current $I_{REF}$ used to determine data of a memory cell may be formed from a resistive element using a diffusion layer or a polysilicon layer.

One terminal of a resistive element 1X is connected to the determination criterion side input terminal of the sense amplifier 610, and the other terminal of the resistive element 1X is grounded via a switch element (transistor) 2X.

The resistive element 1X has a resistance value corresponding to, for example, 1/N (N≥1) times the resistance value RP of an MTJ element in the low resistance state in accordance with the number of memory cells to be simultaneously accessed for data read.

As shown in FIG. 21, a resistive element 1XX configured to generate the reference current $I_{FREF}$ used to determine data of the fuse cell FC may be formed from a resistive element using a diffusion layer or a polysilicon layer. The resistive element 1XX has a resistance value corresponding to 1/N (N≥1) times the resistance value RP of an MTJ element in the low resistance state in accordance with the number of fuse cells FC to be simultaneously accessed for data read. In the example shown in FIG. 21, data is simultaneously read from two fuse cells FC. Hence, the resistive element 1XX having a resistance value half of the resistance value RP of an MTJ element in the low resistance state is used as a reference cell (reference resistance).

As shown in FIGS. 20 and 21, the clamp voltage (reference current) on the determination criterion side may be offset from the clamp voltage (read current) on the determination target side by the fixed resistive element 1X or 1XX without using a cell including an MTJ element. Though the reference current is generated by the resistive element 1X or 1XX using a diffusion layer or a polysilicon layer, an accurate determination criterion can be formed.

Modifications of the MTJ element serving as an anti-fuse element will be described with reference to FIGS. 22 and 23. An anti-fuse MTJ element according to the modifications will be explained here with reference to FIGS. 3 and 4 as needed.

An MTJ element serving as an anti-fuse element may have a structure different from an MTJ element serving as a memory element.

Figure 22:
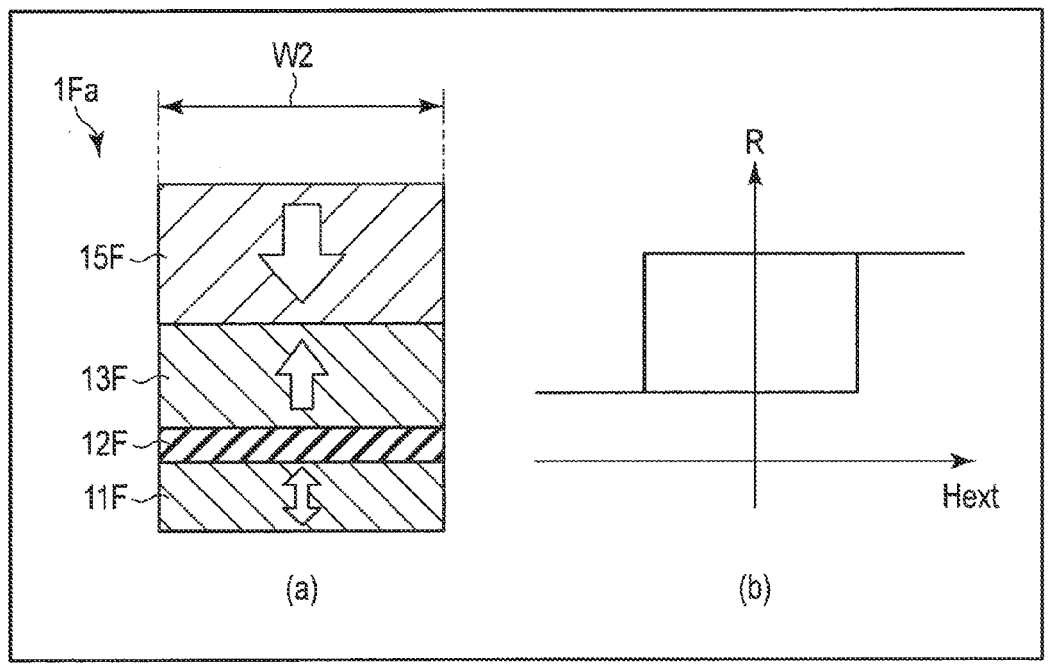

FIG. 22 shows a modification of the MTJ element serving as an anti-fuse element. In FIG. 22, (a) is a sectional view showing the structure of the anti-fuse MTJ element according to the modification, and (b) is a graph showing the magnetic characteristic of the anti-fuse MTJ element shown in (a) of FIG. 22. The abscissa in (b) of FIG. 22 corresponds to an external magnetic field, and the ordinate in (b) of FIG. 22 corresponds to the magnetoresistance of the MTJ element.

As shown in FIG. 22, the size of an anti-fuse MTJ element 1Fa is larger than that of the MTJ element serving as a memory element in FIG. 3.

A size (diameter) W2 of the anti-fuse MTJ element in the direction parallel to the substrate surface is larger than the size W1 of the MTJ element serving as a memory element.

The thermal stability of the MTJ element is represented by thermal stability energy Δ=KuV, where Ku is the magnetic anisotropy energy of the MTJ element (magnetic layer), and V is the volume of the MTJ element (magnetic layer).

When the MTJ element is made small, the thermal stability energy of the MTJ element tends to depend on its size in the diameter direction (the direction parallel to the substrate surface).

When the diameter (volume) of the anti-fuse MTJ element is made larger than that of the MTJ element serving as a memory element, the stability of the antiparallel state (high resistance state or "1" state) of the anti-fuse MTJ element can be improved, as shown in (b) of FIG. 22.

Figure 23:
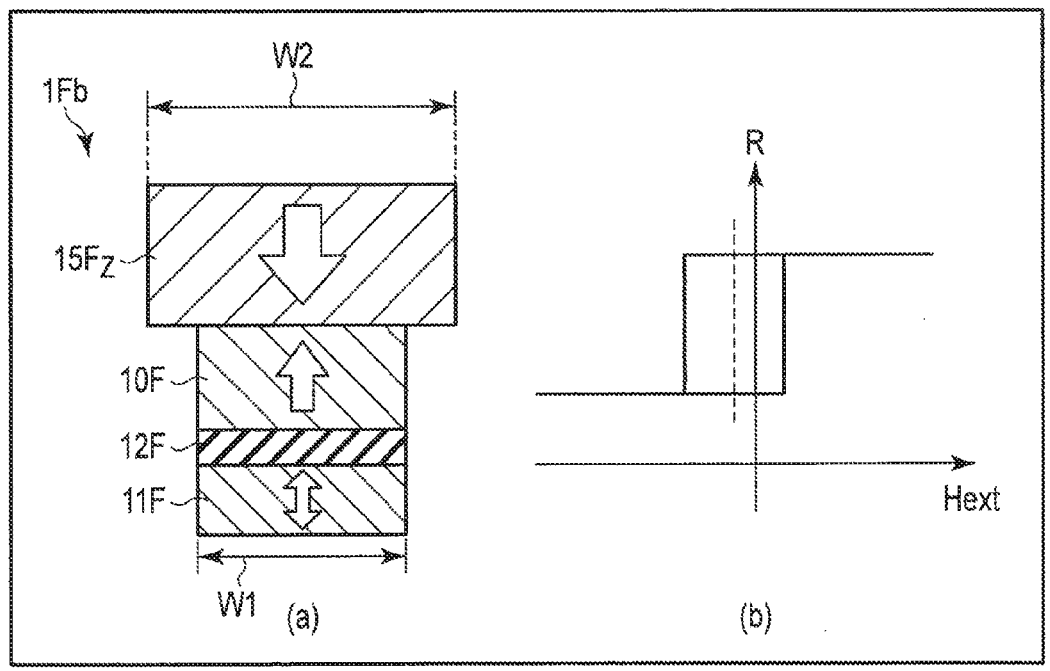

FIG. 23 shows a modification of the MTJ element serving as an anti-fuse element.

In FIG. 23, (a) is a sectional view showing the structure of the anti-fuse MTJ element according to the modification, and (b) is a graph showing the magnetic characteristic of the anti-fuse MTJ element shown in (a) of FIG. 23. The abscissa in (b) of FIG. 23 corresponds to an external magnetic field, and the ordinate in (b) of FIG. 23 corresponds to the magnetoresistance of the MTJ element.

The characteristic of the MTJ element serving as an anti-fuse MTJ element may be adjusted by making the layers included in the anti-fuse MTJ element different from those included in the MTJ element serving as a memory element.

In the example shown in (a) of FIG. 23, the size of a shift adjustment layer 15Fz of the anti-fuse MTJ element is made larger than that of the shift adjustment layer of the MTJ element serving as an memory element.

When the size W2 of the shift adjustment layer 15Fz of the anti-fuse MTJ element is made larger than the size W1 of the reference layer 10F in the direction parallel to the substrate surface, a shifted magnetic field is applied to the storage layer 11F of an anti-fuse MTJ element 1Fb. This shifted magnetic field offsets the center of the hysteresis loop representing the magnetic characteristic of the MTJ element 1Fb.

As a result, as shown in (b) of FIG. 23, the magnetization alignment of the anti-fuse MTJ element 1Fb in which the shifted magnetic field is applied to the storage layer easily changes to the antiparallel state as compared to the MTJ element serving as a memory element.

The example shown in FIG. 23 shows a structure in which the size of the shift adjustment layer of the anti-fuse MTJ element is changed. However, the magnetization of the material of the magnetic layer may be increased.

Alternatively, the film thickness of the magnetic layer (for example, storage layer or reference layer) of the anti-fuse MTJ element may be made larger than that of the magnetic layer of the MTJ element serving as a memory element by forming the anti-fuse MTJ element and the MTJ element in different steps.

When a magnetic field application sheet layer is provided in the anti-fuse MTJ element formation area (anti-fuse area), or a shifted magnetic field is applied to the MTJ element by a magnet layer provided in the package, an MTJ element capable of relatively easily and stably maintaining a magnetization alignment in the antiparallel state can be provided.

The MTJ element serving as an anti-fuse element is preferably selectively formed such that the magnetization alignment of the MTJ element is set only in the antiparallel state when the external magnetic field is zero.

In the above-described way, contrivances are made for the configuration of the MTJ element serving as an anti-fuse element. This makes it possible to suppress unexpected transition of the magnetization alignment of the MTJ element from the antiparallel state to the parallel state or increase the efficiency of the write operation of the MTJ element to the antiparallel state.

<Conclusion>

When an MTJ element of a nonvolatile memory is used as a memory element configured to store correction information used to repair a defect in the cell array, the capability of thermal stability as nonvolatile information storage performance may pose a problem such as unexpected magnetization reversal of a magnetic layer caused by heat. The difference between the resistance value of the MTJ element having a parallel magnetization alignment (parallel state) and that of the MTJ element having an antiparallel magnetization alignment (antiparallel state) is determined by the material or the structure used to form the MTJ element. This may make it difficult to attain high reliability of the correction information of the cell array by the MTJ element in the low resistance state and that in the high resistance state.

There is demanded a memory that can implement not only a prevention of data destruction but also a normal memory operation using redundancy information or the like not only when the operation temperature or storage temperature of the memory based on certain specifications is met but also when the user has temporarily placed the electronic device including the memory under a high temperature.

In the MRAM according to this embodiment, an MTJ element is used as an anti-fuse serving as an element configured to store correction information for a defect in the memory. Correction information based on a test result for the cell array is written in the MTJ element serving as an anti-fuse by setting the MTJ element in the blown state or high resistance state (antiparallel state).

When an MTJ element is used as an anti-fuse element as in this embodiment, a large resistance difference can be attained between an MTJ element in the blown state and that in the high resistance state. In addition, magnetization reversal does not occur in an MTJ element in the blown state in which the magnetic tunnel junction is broken.

Hence, according to this embodiment, it is possible to provide an MRAM having high reliable redundancy.

(2) Second Embodiment

A nonvolatile memory (for example, MRAM) according to the second embodiment will be described with reference to FIG. 24. In the second embodiment, a description of the components, functions, and operations that are substantially the same as in the first embodiment will be omitted.

FIG. 24 is a block diagram for explaining an example of the configuration of the fuse circuit of the MRAM according to the second embodiment. Note that in the second embodiment, components other than the fuse circuit are substantially the same as in the first embodiment.

As shown in FIG. 24, in the nonvolatile memory according to this embodiment, a fuse circuit 900A includes both a fuse element FE and an anti-fuse element 1F formed from a nonvolatile memory element (MTJ element in this case) as elements that store correction information (redundancy information, replacement information, or defect repair information) of the cell array.

The fuse circuit 900A has a predetermined error correcting capability.

A redundancy register 205 (305) in a column/row control circuit is formed from D flip flops 251 connected in series. For example, the redundancy register 205 (305) is a shift register formed from the plurality of D flip flops 251.

A clock signal FCLK of the fuse circuit 900A is supplied to the control terminal of each D flip flop 251. Note that the clock signal FCLK can be an internal clock signal CLK of the chip or a clock signal generated by the fuse circuit 900A based on the external clock signal CLK.

In this embodiment, the plurality of fuse elements FE are provided in the fuse circuit 900A in addition to a plurality of anti-fuse MTJ elements 1F. For example, the fuse element FE is a laser fuse element FE that is nonelectrically programmed. The laser fuse element FE is rendered nonconductive when blown by a laser.

The area where the laser fuse elements FE are provided will be referred to as a laser fuse area 902 or laser fuse circuit 902 hereinafter.

For example, the number of laser fuse elements FE, the number of anti-fuse elements 1F, and the number of D flip flops 251 are equal.

Data AFD from an anti-fuse area 901 and data FD from the laser fuse area 902 are supplied to the redundancy register 205 (305) via clocked buffers 990.

For example, the output signals (fuse data) AFD and FD of the redundancy register 205 (305) may be transferred outside the chip as chip analysis information.

An address counter 980 causes a forward processing unit 981 to increment a supplied address signal or a backward processing unit 982 to decrement it. The incremented or decremented signal is output to the read circuit or write circuit.

A comparator 970 compares the output from the anti-fuse MTJ element 1F with the output from the laser fuse element FE. The comparison result of the comparator 970 is output to, for example, a status register 800. It is determined by the data comparison of the comparator 970 whether the data (correction information) stored in the anti-fuse MTJ element 1F is correct. In addition, a defect in the anti-fuse area 901 is detected by the comparison result of the comparator 970.

The comparator 970 preferably has a function of comparing all data in the anti-fuse area 901 with all data in the laser fuse area 902 at the time of purchase return based on a preset external command and outputting the comparison result. In addition, the comparator 970 preferably has a function of outputting all data AFD and FD in the anti-fuse area 901 and the laser fuse area 902 based on a preset external command.

For example, breakage of an MTJ element depends on the voltage/current application time and the magnitude of stress. To suppress deterioration of the manufacturing yield of MRAMs in the manufacturing process of the MRAM, it is realistic to design an MRAM with consideration given to the fact that the time of application of stress to the MTJ element and the magnitude of stress are limited.

Hence, when an MTJ element is used as an anti-fuse element configured to store correction information, a circuit configuration that need not break all of the MTJ elements designed to cause dielectric breakdown is preferably used by utilizing data encoding technology.

For this reason, data stored in a fuse cell FC including an anti-fuse MTJ element is preferably data obtained by encoding the data FD stored in the laser fuse element FE and adding a redundancy code capable of error correction to the encoded data. The data AFD read from the fuse cell FC is decoded data obtained by error-correcting the encoded data.

To encode and decode data stored in the fuse circuit 900A, an encoding circuit 992 and a decoding circuit 993 may be provided in the fuse circuit.

A selector 995 may be provided to make it possible to select whether to use the laser fuse element FE or the anti-fuse MTJ element 1F based on an external selection signal SLT at the time of shipment of chips.

The fuse circuit 900A using both the laser fuse element and the anti-fuse MTJ element in the MRAM is driven in, for example, the following way.

For example, a predetermined laser fuse element FE is blown based on a test result of the chip.

Data write in the anti-fuse MTJ element 1F is executed based on the information of the laser fuse element FE in the laser fuse area 902.

More specifically, pieces of information in the laser fuse area 902 are read to the redundancy register 205 (305). The pieces of information read from the laser fuse area 902 are transferred to a write circuit 905 of the anti-fuse area 901 using the data transfer function of the D flip flops 251 that form the redundancy register (shift register) 205 (305), and sequentially written in the predetermined anti-fuse MTJ elements 1F.

Data read from the anti-fuse area 901 to the redundancy register 205 (305) is executed by transferring data of the anti-fuse MTJ elements 1F to the redundancy register 205 (305) formed from the plurality of D flip flops 251 connected in series.

The technique of blowing the laser fuse element FE is optimized for mass production of semiconductor chips. It is therefore possible to simplify programming of correction information that changes between chips while using a production flow using a laser fuse element that is a mature technology in a nonvolatile memory including a new anti-fuse element using a resistance change element as in this embodiment.

In addition, at the time of purchase return, information of the anti-fuse element formed from an MTJ element and that of a laser fuse are compared, thereby executing a field test substantially without risk.

For example, some of row/column addresses of the correction information of the cell array may be stored in the laser fuse elements FE, and the remaining row/column addresses of the correction information may be stored in the anti-fuse MTJ elements.

In addition, pieces of column correction information (column addresses) used to replace a defective cell with a redundancy cell may be stored in the laser fuse elements FE, and pieces of row correction information (row addresses) may be stored in the anti-fuse MTJ elements 1F. Conversely, pieces of row correction information used to replace a defective cell with a redundancy cell may be stored in the laser fuse elements FE, and pieces of column correction information may be stored in the anti-fuse MTJ elements 1F. This means performing complicated relief processing by fuse elements using an external computer, and carrying out rationalized relief processing by anti-fuse elements.

When introducing a new nonvolatile memory on the market, chips including a redundancy circuit using laser fuses and nonvolatile memory fuses for risk management are preferably put into circulation as an early generation of this new type of nonvolatile memory.

For this reason, when a fuse circuit including anti-fuse elements and fuse elements formed from MTJ elements is used as a circuit configured to store correction information used to repair a defective memory cell, as in the nonvolatile memory (for example, MRAM) according to the second embodiment, a nonvolatile memory having high reliable redundancy can be provided.

(3) Other Embodiments

FIGS. 3 and 4 illustrate an example in which a perpendicular magnetization MTJ element whose magnetic layer has a magnetization direction perpendicular to the film surface is used. However, the magnetoresistive element (MTJ element) serving as a memory element or anti-fuse element of the nonvolatile memory according to the embodiment may be a parallel magnetization film (in-plane magnetization film) whose magnetic layer has a magnetization direction parallel to the film surface.

In this embodiment, considering the configuration that regards MTJ element breakage as a phenomenon proportional to an applied voltage and discriminates between the resistance value of an MTJ element and the parasitic resistance (the resistance value of a blown MTJ element), a circuit configuration suitable for breakage of an MTJ element in the antiparallel state has been described. However, a circuit configuration suitable for breakage of an MTJ element in the parallel state may be employed.

The nonvolatile memory element used in the nonvolatile memory according to this embodiment is not limited to an MTJ element as long as the memory element has a structure with an insulating film included between electrodes. For example, a variable resistive element having a structure with a transition metal oxide sandwiched between electrodes, like a memory element of an ReRAM, may be used as a memory element or an anti-fuse element of a resistance change memory according to this embodiment.

In the nonvolatile memory according to the embodiment, the type of memory elements in the memory area where external data is stored and the type of memory elements in the fuse circuit may be different as long as the anti-fuse elements in the fuse circuit are magnetoresistive elements. For example, memory elements in the memory area may be memory cell transistors including a charge storage layer (for example, at least one of a floating gate electrode and a charge trap layer).

When one memory device includes a fuse circuit including magnetoresistive elements serving as anti-fuse elements and a circuit (memory circuit) including a memory area where external data is stored, the fuse circuit and the memory circuit may be formed on chips (semiconductor substrates) different from each other.

The resistance change memory (for example, MRAM) according to each of the above-described embodiments is used as an alternative memory of, for example, a DRAM, SRAM, or the like. For example, the MRAM according to the embodiment is applicable as a cache memory or buffer memory of a storage device such as an SSD (Solid State Drive).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile memory comprising:
   a memory area including a plurality of first magnetoresistive elements each serving as a memory element, each of the plurality of the first magnetoresistive elements including a first storage layer, a first reference layer, and a first insulating film between the first storage layer and the first reference layer;
   a fuse circuit configured to store correction information of the memory area when a defect exists in the memory area, the fuse circuit including a plurality of second magnetoresistive elements and a plurality of fuse elements, the plurality of second magnetoresistive elements each serving as an anti-fuse element, each of the plurality of the second magnetoresistive elements including a second storage layer, a second reference layer, and a second insulating film between the second storage layer and the second reference layer, and the plurality of fuse elements each configured to store at least part of the correction information; and
   a redundancy area including a plurality of third magnetoresistive elements each serving as a redundancy element, each of the plurality of the third magnetoresistive elements including a third storage layer, a third reference layer, and a third insulating film between the third storage layer and the third reference layer,
   wherein when an external address signal matches the correction information, one third magnetoresistive element among the plurality of third magnetoresistive elements is selected.

2. The memory according to claim 1, further comprising a plurality of registers a number of which is as large as at least one of a number of the plurality of fuse elements and a number of the plurality of second magnetoresistive elements, wherein the plurality of registers are configured to store data of the plurality of the fuse elements and the plurality of second magnetoresistive elements.

3. The memory according to claim 2, wherein the number of the plurality of fuse elements equals the number of the plurality of registers.

4. The memory according to claim 1, wherein the fuse circuit writes data stored in the plurality of fuse elements to the plurality of second magnetoresistive elements.

5. The memory according to claim 1, wherein
   the fuse circuit has error correcting capability and includes an encoding circuit configured to encode data stored in the plurality of fuse elements, and a decoding circuit configured to decode data read from the plurality of second magnetoresistive elements, and
   the encoded data of the plurality of fuse elements are stored in the plurality of second magnetoresistive elements.

6. The memory according to claim 1, wherein the fuse circuit includes a comparator configured to compare data stored in the plurality of fuse elements and data stored in the plurality of second magnetoresistive elements.

7. The memory according to claim 6, wherein after the correction information is written in the fuse circuit, a write operation for setting a resistance value of each of the plurality of second magnetoresistive elements to a first resistance value is executed.

8. The memory according to claim 1, further comprising a third read circuit shared by data read for the plurality of first magnetoresistive elements and data read for the plurality of second magnetoresistive elements,
   wherein:
   the memory area is provided in a cell array, and
   the plurality of second magnetoresistive elements are provided in the cell array so as to be adjacent to the memory area.

9. The memory according to claim 8, wherein the redundancy area is provided in the cell array.

10. The memory according to claim 1, wherein a size of each of the plurality of second magnetoresistive elements is larger than a size of each of the plurality of first magnetoresistive elements.

11. The memory according to claim 1, wherein:
    each of the plurality of first magnetoresistive elements further includes a first magmatic layer including a magnetization facing opposite to a magnetization direction of the first reference layer,
    each of the plurality of second magnetoresistive elements further includes a second magmatic layer including a magnetization facing opposite to a magnetization direction of the second reference layer, and
a size of the second magmatic layer in a direction parallel to a film surface of the second magmatic layer is larger than a size of the first magmatic layer in a direction parallel to a film surface of the first magmatic layer.

* * * * *